US012696530B2

(12) United States Patent     (10) Patent No.:   US 12,696,530 B2

Ghosh et al.     (45) Date of Patent:    Jul. 28, 2026

(54) METAL GATE CUT FORMED AFTER SOURCE AND DRAIN CONTACTS

(71) Applicant: Intel Corporation, Santa Clara, CA (US)

(72) Inventors: Swapnadip Ghosh, Hillsboro, OR (US); Matthew J. Prince, Portland, OR (US); Alison V. Davis, Portland, OR (US); Chun C. Kuo, Hillsboro, OR (US); Andrew Arnold, Hillsboro, OR (US); Reza Bayati, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 87 days.

(21) Appl. No.: 17/936,934

(22) Filed: Sep. 30, 2022

(65) Prior Publication Data

US 2024/0112916 A1     Apr. 4, 2024

(51) Int. Cl.
    H10D 84/00     (2025.01)
    H10D 30/43     (2025.01)
    (Continued)

(52) U.S. Cl.
    CPC ........... H10D 84/832 (2025.01); H10D 30/43 (2025.01); H10D 30/6735 (2025.01);
    (Continued)

(58) Field of Classification Search
    CPC .. H10D 84/32; H10D 84/834; H10D 30/6735; H10D 62/121
    See application file for complete search history.

(56) References Cited

U.S. PATENT DOCUMENTS

2011/0241160 A1* 10/2011 Kerber ................... H10D 84/00
                                            257/E29.325
2015/0236106 A1    8/2015 Zaleski et al.
                      (Continued)

FOREIGN PATENT DOCUMENTS

EP         3493247 A1     6/2019

OTHER PUBLICATIONS

"Around." Merriam-Webster.com. 2025. https://www.merriam-webster.com/dictionary/around (Oct. 30, 2025). (Year: 2025).*
(Continued)

*Primary Examiner* — Reema Patel
(74) *Attorney, Agent, or Firm* — Schwabe, Williamson & Wyatt P.C.

(57) ABSTRACT

Techniques are provided herein to form semiconductor devices that include a gate cut formed after the formation of source/drain contacts. In an example, a semiconductor device includes a gate structure around or otherwise on a semiconductor region that extends from a source region to a drain region. Conductive contacts formed over the source and drain regions along a source/drain trench. The gate structure may be interrupted with a dielectric gate cut that further extends past the gate trench and into the source/drain trench where it can cut into one or more of the contacts. The contacts are formed before the gate cut to ensure complete fill of conductive material when forming the contacts. Accordingly, a liner structure on the conductive contacts is also broken by the intrusion of the gate cut and does not extend further up or down the sidewalls of the gate cut.

20 Claims, 16 Drawing Sheets

(51) Int. Cl.

| | |
|---|---|
| *H10D 30/67* | (2025.01) |
| *H10D 62/10* | (2025.01) |
| *H10D 84/01* | (2025.01) |
| *H10D 84/03* | (2025.01) |
| *H10D 84/83* | (2025.01) |

(52) U.S. Cl.
CPC ....... *H10D 62/121* (2025.01); *H10D 84/0151*
(2025.01); *H10D 84/038* (2025.01); *H10D*
*84/83* (2025.01)

(56) References Cited

U.S. PATENT DOCUMENTS

| | | | |
|---|---|---|---|
| 2018/0269306 A1 | 9/2018 | Bao et al. | |
| 2019/0378790 A1* | 12/2019 | Bohr ................. | H10D 30/6219 |
| 2019/0393324 A1 | 12/2019 | Chen et al. | |

OTHER PUBLICATIONS

Extended European Search Report received for EP Application No.
23187452.0, dated Feb. 16, 2024. 9 pages.

* cited by examiner 204
202

201

204
202

201

1300

1400

METAL GATE CUT FORMED AFTER SOURCE AND DRAIN CONTACTS

FIELD OF THE DISCLOSURE

The present disclosure relates to integrated circuits, and more particularly, to metal gate cuts made in semiconductor devices.

BACKGROUND

As integrated circuits continue to scale downward in size, a number of challenges arise. For instance, reducing the size of memory and logic cells is becoming increasingly more difficult, as is reducing device spacing at the device layer. As transistors are packed more densely, the formation of certain device structures used to isolate adjacent transistors becomes challenging. Accordingly, there remain a number of non-trivial challenges with respect to forming semiconductor devices.

BRIEF DESCRIPTION OF THE DRAWINGS

FIG. 1C' is a plan view of an integrated circuit showing a gate cut formed before the source and drain contacts are formed, causing incomplete fill of the contacts.

Figure 1A:
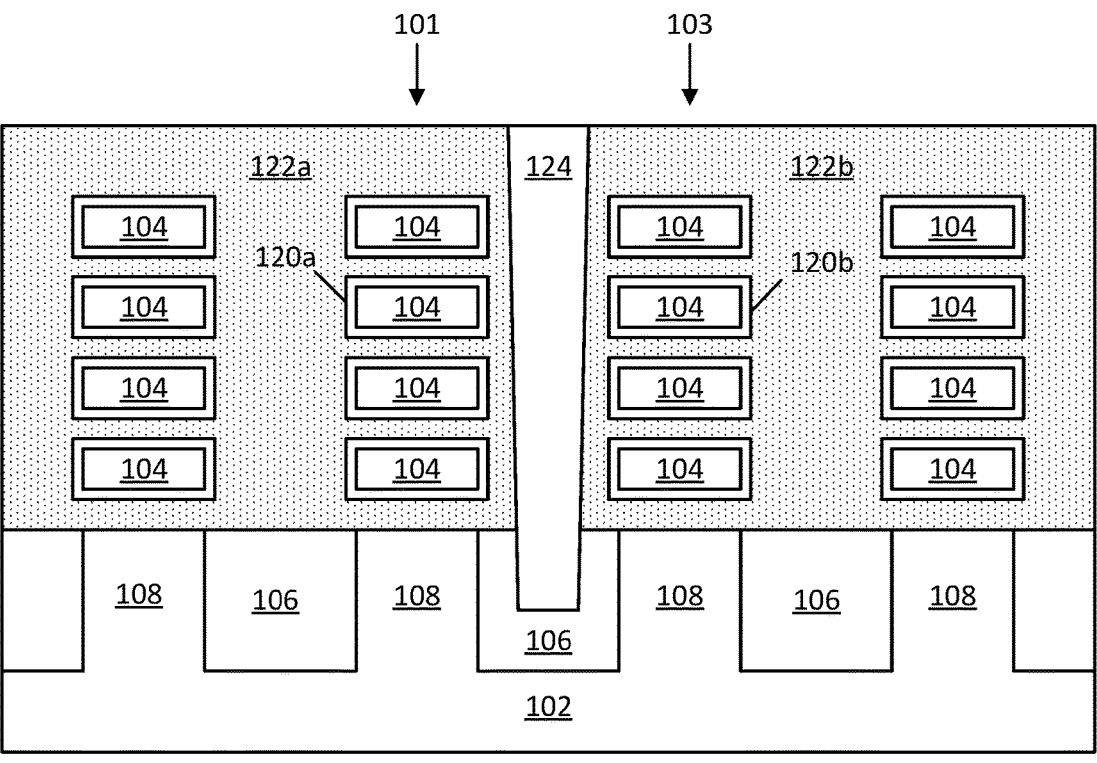
FIGS. 1A and 1B are cross-sectional views of some semiconductor devices that illustrate a gate cut between devices formed after the source and drain contacts are formed, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein to form semiconductor devices that include a gate cut formed after the formation of source/drain contacts (also herein sometimes called epi contacts, depending on their forming process). The techniques can be used in any number of integrated circuit applications and are particularly useful with respect to device layer transistors, such as finFETs or gate-all-around transistors (e.g., ribbonFETs and nanowire FETs). In an example, a semiconductor device includes a gate structure around or otherwise on a semiconductor region. The semiconductor region can be, for example, a fin of semiconductor material that extends from a source region to a drain region, or one or more nanowires or nanoribbons or nanosheets of semiconductor material that extend from a source region to a drain region. Conductive contacts are formed over the source and drain regions along a source/drain contact recess or trench. The contacts may extend within the source and drain regions, and/or along sides of the source and drain regions, and/or wrap around the source and drain regions. The gate structure may be interrupted, for example, between two transistors with a gate cut that extends through an entire thickness of the gate structure and includes a dielectric material to electrically isolate the portions of the gate structure on either side of the gate cut. The gate cut may further extend past the gate structure and into the source/ drain contact trench region where the gate cut can cut into one or more of the source and drain contacts. The source and drain contacts are formed before the gate cut to ensure complete fill of conductive material when forming the contacts. Accordingly, a liner structure of a given conductive contact, or otherwise between a source or drain region and a corresponding conductive contact, is also broken by the intrusion of the gate cut and does not extend up or down any sidewalls of the later-formed gate cut. The liner structure may, however, abut the later-formed gate cut. Numerous variations and embodiments will be apparent in light of this disclosure.

General Overview

As previously noted above, there remain a number of non-trivial challenges with respect to integrated circuit fabrication. In more detail, as devices become smaller and more densely packed, many structures become more challenging to fabricate as critical dimensions (CD) of the structures push the limits of current fabrication technology. Example structures like gate cuts are used in integrated circuit design to isolate gate structures from one another. One possible way to form gate cuts is to use a gate patterning scheme that uses the poly-cut flow, where the gate cut is formed prior to formation of the final metal gate. Another approach might be to use a gate patterning scheme that uses the metal gate cut flow. Such approaches generally etch a trench or other recess through a thickness of the poly or metal gate structure and fill the trench with a dielectric material. The timing of when in the process flow such gate cuts are formed can have an impact on the formation of other structures. For example, gate cuts are formed before the formation of conductive contacts made over source or drain regions. However, the gate cuts may extend into the source/drain contact trench region and thus interrupt the formation of the contacts, leading to incomplete fill and voids in the contacts.

Thus, and in accordance with an embodiment of the present disclosure, gate cut forming techniques are provided herein that include forming source and drain contacts within the source/drain contact trench prior to formation of any gate cuts, to avoid interference caused by the presence of the gate cut during the formation of the source and drain contacts. In an example, the formation of the source and drain contacts involves the formation of a liner structure between the semiconductor (e.g., epitaxial) material of the source or drain region and the metal material (e.g., tungsten) of the contact itself. The liner structure may include more than one material layer, such as any number of conductive material layers. In some examples, one material layer of the liner structure may include a titanium-based material, such as titanium nitride, titanium silicide, or titanium germano-silicide. The material layer may be used to provide an enhanced ohmic contact between the source or drain region and the metal contact. In some examples, another material layer of the liner may include a combination of tungsten, carbon, and nitrogen and act as an adhesion layer for the metal material (e.g., tungsten) of the contact. Still other material layers may be used in the liner structure that include silicon and nitrogen in various concentrations. Since the liner structure may be formed over any exposed surfaces within the source/drain contact trench, it can be used to indicate that the gate cut was formed after the formation of the source and drain contacts. According to some embodiments, a gate cut extends into the source/drain contact trench and interrupts at least a portion of the source and drain contacts, and the liner structure may abut the gate cut (e.g., at the point where the gate cut interrupts) but does not extend up or down any sidewalls of the gate cut.

According to an embodiment, an integrated circuit includes a semiconductor region extending in a first direction from a first source or drain region to a second source or drain region, a gate structure extending in a second direction over the semiconductor region, a liner structure having one or more layers of conductive material on the first source or drain region, a conductive contact on the liner structure, and a gate cut adjacent to the semiconductor region and extending in the first direction through the gate structure and interrupting at least a portion of the conductive contact. The gate cut includes a dielectric material and the liner structure does not extend up or down any sidewalls of the gate cut, although an end of the liner structure may abut the gate cut at a point where the gate cut trench passes by.

According to an embodiment, an integrated circuit includes a semiconductor region extending in a first direction from a first source or drain region to a second source or drain region, a gate structure extending in a second direction over the semiconductor region, a first liner structure having one or more first layers of conductive material on the first source or drain region, a second liner structure having one or more second layers of conductive material on the second source or drain region, and a gate cut adjacent to the semiconductor region and extending in the first direction through the gate structure and interrupting at least a portion of the first conductive contact and at least a portion of the second conductive contact. The gate cut includes a dielectric material. The first liner structure extends laterally and thus its end surface may abut the gate cut, but the first liner structure does not extend up or down sidewalls of the gate cut. Likewise, and the second liner structure extends laterally and thus may abut the gate cut, but the second liner structure does not extend up or down sidewalls of the gate cut.

According to another embodiment, a method of forming an integrated circuit includes forming a fin comprising a semiconductor material, the fin extending above a substrate and extending in a first direction; forming a source or drain region at an end of the semiconductor material; forming a gate structure extending over the semiconductor material in a second direction different from the first direction; forming one or more layers of conductive material on the source or drain region; forming a conductive contact on the one or more layers of conductive material; forming a recess through the gate structure adjacent to the fin and through at least a portion of the conductive contact; and forming a dielectric material within the recess.

The techniques can be used with any type of non-planar transistors, including finFETs (sometimes called tri-gate transistors), nanowire and nanoribbon transistors (sometimes called gate-all-around transistors), or forksheet transistors, to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate structure can be implemented with a gate-first process or a gate-last process (sometimes called a replacement metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the presence of a gate cut extending into a source or drain contact where a liner structure between the contact and the underlying source or drain region abuts a sidewall of the gate cut and does not extend any further up or down the sidewall of the gate cut. The thickness of the liner structure that abuts the gate cut may be relatively small, such as the example case where the thickness at the abutting end(s) of one or two conformal conductive layers making up the liner structure is in the range of about 5 nm to 15 nm (e.g., about 7 nm to about 15 nm for overall thickness, and about 2 nm or 3 nm to 6 nm or 8 nm for each layer). Such lateral abutting at the end of the liner structure is not considered to involve the liner structure extending up or down along the sidewall of the gate cut like a conformal layer deposited after the gate cut would extend up or down the gate cut. Numerous configurations and variations will be apparent in light of this disclosure.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," "top," "bottom," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Architecture

Figure 1B:
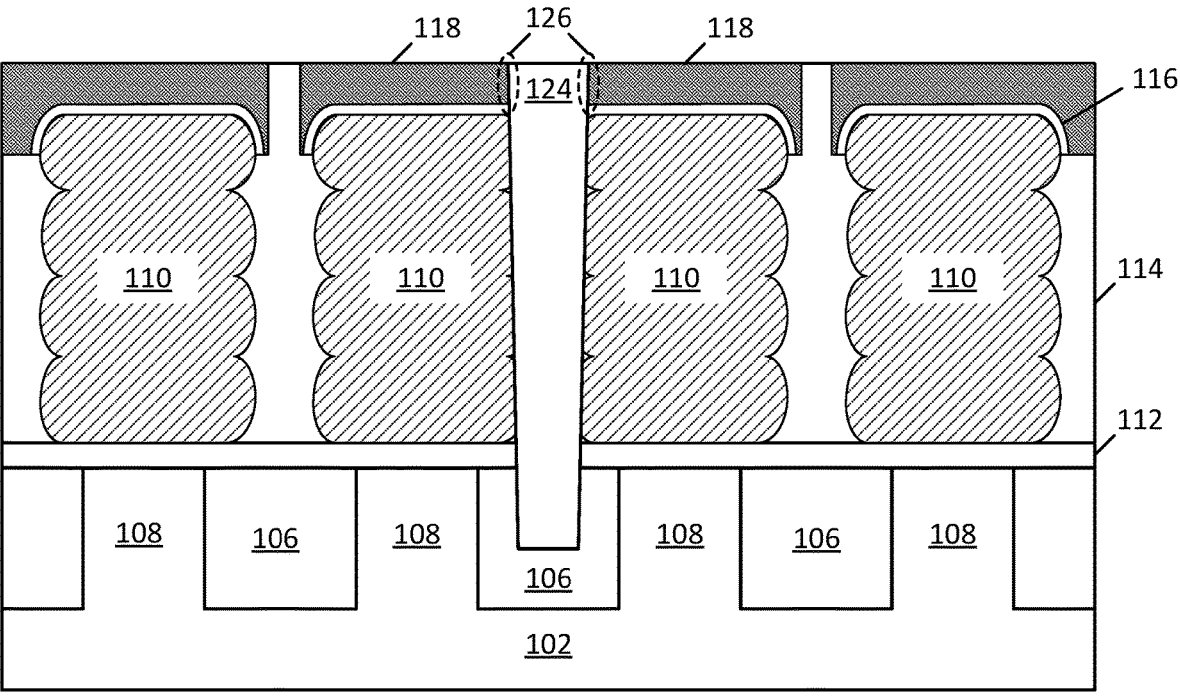

FIG. 1A is a cross sectional view taken across the gate trench of four example semiconductor devices with two of the devices identified as a first semiconductor device 101 and a second semiconductor device 103, according to an embodiment of the present disclosure. FIG. 1B is another cross sectional view taken across the source/drain region (and contact trench) adjacent to the gate trench either into or out of the page of FIG. 1A. Each of semiconductor devices 101 and 103 may be non-planar metal oxide semiconductor (MOS) transistors, such as tri-gate (e.g., finFET) or gate-all-around (GAA) transistors, although other transistor topologies and types could also benefit from the techniques provided herein. The illustrated embodiments herein use the GAA structure. The various illustrated semiconductor devices represent a portion of an integrated circuit that may contain any number of similar semiconductor devices.

As can be seen, semiconductor devices 101 and 103 are formed on a substrate 102. Any number of semiconductor devices can be formed on substrate 102, but four are illustrated here as an example. Substrate 102 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed.

Alternatively, substrate 102 can be a semiconductor-on-insulator substrate having a desired semiconductor layer over a buried insulator layer (e.g., silicon over silicon dioxide). Alternatively, substrate 102 can be a multilayer substrate or superlattice suitable for forming nanowires or nanoribbons (e.g., alternating layers of silicon and SiGe, or alternating layers indium gallium arsenide and indium phosphide). Any number of substrates can be used. In some embodiments, a lower portion of (or all of) substrate 102 is removed and replaced with one or more backside interconnect layers to form backside signal and power routing, during a backside process.

Each of semiconductor devices 101 and 103 includes one or more nanoribbons 104 that extend parallel to one another along a direction between source or drain regions 110 (e.g., a first direction into and out of the page in the cross-section view of FIG. 1A). Nanoribbons 104 are one example of semiconductor regions or semiconductor bodies that extend between source or drain regions 110. The term nanoribbon may also encompass other similar shapes such as nanowires or nanosheets. The semiconductor material of nanoribbons 104 may be formed from substrate 102. In some embodiments, semiconductor devices 101 and 103 may each include semiconductor regions in the shape of fins that can be, for example, native to substrate 102 (formed from the substrate itself), such as silicon fins etched from a bulk silicon substrate. Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of the illustrated nanoribbons 104 during a gate forming process where one type of the alternating layers is selectively etched away so as to liberate the other type of alternating layers within the channel region, so that a gate-all-around (GAA) process can then be carried out. Again, the alternating layers can be blanket deposited and then etched into fins or deposited into fin-shaped trenches.

As can further be seen, adjacent semiconductor devices are separated by a dielectric fill 106 that may include silicon oxide. Dielectric fill 106 provides shallow trench isolation (STI) between any adjacent semiconductor devices. Dielectric fill 106 can be any suitable dielectric material, such as silicon dioxide, aluminum oxide, or silicon oxycarbonitride.

Semiconductor devices 101 and 103 each include a subfin region 108. According to some embodiments, subfin region 108 comprises the same semiconductor material as substrate 102 and is adjacent to dielectric fill 106. According to some embodiments, nanoribbons 104 (or other semiconductor bodies) extend between source or drain regions 110 in the first direction to provide an active region for a transistor (e.g., the semiconductor region beneath the gate). It should be understood that the source or drain regions 110 illustrated in the cross-section of FIG. 1B are only along one side of nanoribbons 104 (e.g., out of the page of FIG. 1A) and that similar source or drain regions would be present along the opposite side of nanoribbons 104 (e.g., into the page of FIG. 1A).

According to some embodiments, source or drain regions 110 are epitaxial regions that are provided using an etch-and-replace process. In other embodiments source or drain regions 110 could be, for example, implantation-doped native portions of the semiconductor fins or substrate. Any semiconductor materials suitable for source and drain regions can be used (e.g., group IV and group III-V semiconductor materials). The composition and doping of source or drain regions 110 may be the same or different, depending on the polarity of the transistors. In an example, for instance, one transistor is a p-type MOS (PMOS) transistor, and the other transistor is an n-type MOS (NMOS) transistor. Any number of source or drain configurations and materials can be used.

According to some embodiments, a lower dielectric layer 112 exists beneath source or drain regions 110. Lower dielectric layer 112 can include any suitable dielectric material, such as silicon oxide or silicon nitride and may be provided to isolate source or drain regions 110 from subfin regions 108. According to some embodiments, another dielectric fill 114 is provided around and over portions of source or drain regions 110 along the source/drain trench after epitaxial formation of the source/drain regions is complete. Accordingly, each source or drain region 110 may be isolated from any adjacent source or drain regions 110 by dielectric fill 114. Dielectric fill 114 may be any suitable dielectric material, although in some embodiments, dielectric fill 114 includes the same dielectric material as dielectric fill 106 or lower dielectric layer 112. In one example, each of dielectric fill 114, lower dielectric layer 112, and dielectric fill 106 includes silicon oxide.

According to some embodiments, a liner structure 116 is formed at least on any exposed surfaces of source or drain regions 110. In some embodiments, liner structure 116 is formed on all exposed surfaces within the source/drain contact trench, including on any exposed surfaces of dielectric fill 114. Liner structure 116 may include any number of conductive layers that improve the performance of the device. For example, liner structure 116 may include a first conductive layer that includes a titanium-based material, such as titanium nitride, titanium silicide, or titanium germano-silicide, and a second conductive layer that includes a combination of tungsten, carbon and nitrogen. The first layer may provide an enhanced ohmic contact between source or drain region 110 and a conductive contact 118, while the second layer may provide better adhesion for conductive contact 118. Still other material layers may be used in liner structure 116 that include silicon and nitrogen in various concentrations. Liner structure 116 may have a total thickness, for example, between about 2 nm and about 20 nm, such as between about 5 nm and about 15 nm, or between about 7 and about 12 nm. In one such example, the liner structure 116 includes a first conductive layer of titanium-based material (e.g., titanium nitride, titanium silicide, or titanium germano-silicide) and a second conductive layer that includes a combination of tungsten, carbon and nitrogen, and the overall thickness of the liner structure 116 is between about 7 and about 12 nm.

According to some embodiments, one or more conductive contacts 118 are present on or over one or more corresponding source or drain regions 110. Conductive contacts 118 may be formed directly on liner structure 116, according to some embodiments. Conductive contacts 118 may be any suitably conductive material such as tungsten (W). Other conductive materials may include copper (Cu), ruthenium (Ru), cobalt (Co), titanium (Ti), molybdenum (Mo), or any alloys thereof.

According to some embodiments, a first gate structure extends over nanoribbons 104 of semiconductor device 101 along a second direction across the page while a second gate structure extends over nanoribbons 104 of semiconductor device 103 along the second direction. Each gate structure includes a respective gate dielectric 120a/120b and a gate layer (or gate electrode) 122a/122b. Gate dielectric 120a/120b represents any number of dielectric layers present between nanoribbons 104 and gate electrode 122a/122b. Gate dielectric 120a/120b may also be present on the surfaces of other structures within the gate trench, such as on subfin region 108. Gate dielectric 120a/120b may include any suitable gate dielectric material(s). In some embodiments, gate dielectric 120a/120b includes a layer of native oxide material (e.g., silicon oxide) on the nanoribbons or other semiconductor regions making up the channel region of the devices, and a layer of high-k dielectric material (e.g., hafnium oxide) on the native oxide.

Gate electrode 122a/122b may represent any number of conductive layers, such as any metal, metal alloy, or doped polysilicon layers. In some embodiments, gate electrode 122a/122b includes one or more workfunction metals around nanoribbons 104. In some embodiments, one of semiconductor devices 101 and 103 is a p-channel device that include a workfunction metal having titanium around its nanoribbons 104 and the other semiconductor device is an n-channel device that includes a workfunction metal having tungsten around its nanoribbons 104. Gate electrode 122a/122b may also include a fill metal or other conductive material around the workfunction metals to provide the whole gate electrode structure.

As further shown in this example, adjacent gate structures may be separated along the second direction (e.g., across the page) by a gate cut 124, which acts like a dielectric barrier between gate structures. Gate cut 124 may include a sufficiently insulating material, such as any suitable dielectric material. Example dielectric materials for gate cut 124 include silicon nitride, silicon oxide, silicon carbide, or silicon oxynitride. According to some embodiments, gate cut 124 also extends in the first direction (into and out of the page) such that it may cut across a portion of at least conductive contacts 118 as shown in FIG. 1B. In some examples, gate cut 124 also cuts into at least a portion of source or drain regions 110. According to some embodiments, gate cut 124 is formed after the formation of liner structure 116 and conductive contacts 118. In the illustrated example, although an end of liner structure 116 abuts a portion of gate cut 124, liner structure 116 does not extend any further up or down the sidewall of gate cut 124. In some examples, conductive contact 118 directly contacts sidewall portions 126 of gate cut 124 (e.g., with no liner structure 116 between them).

Figure 1C:
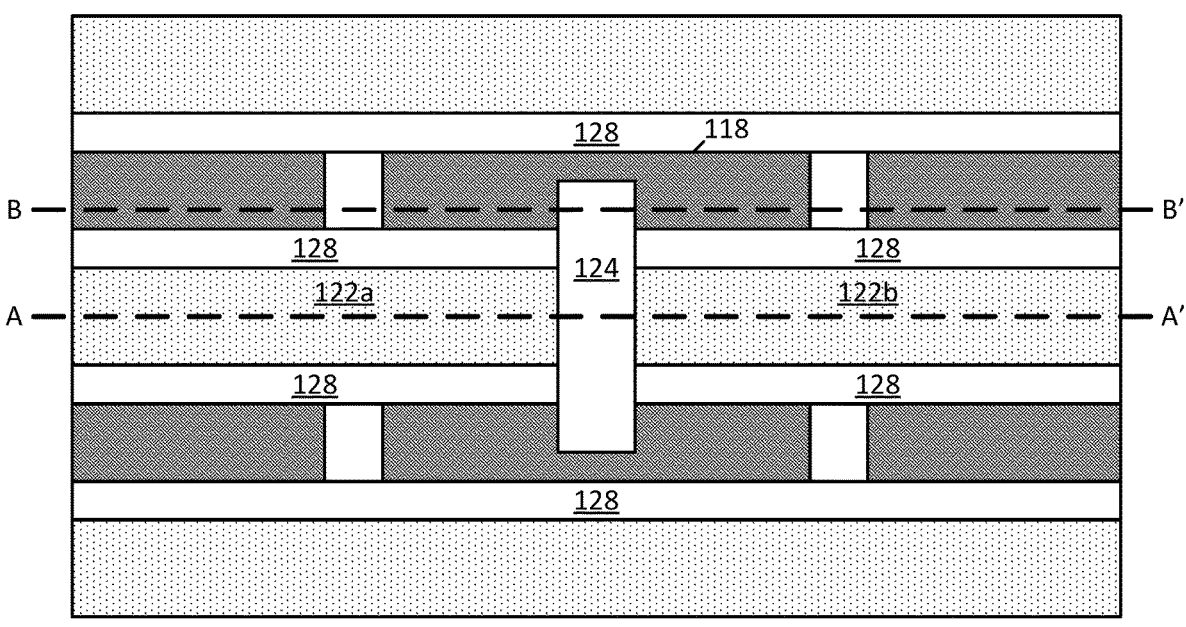
FIG. 1C is a plan view of an integrated circuit showing a gate cut formed after the source and drain contacts are formed, in accordance with an embodiment of the present disclosure.
Figure 1C:
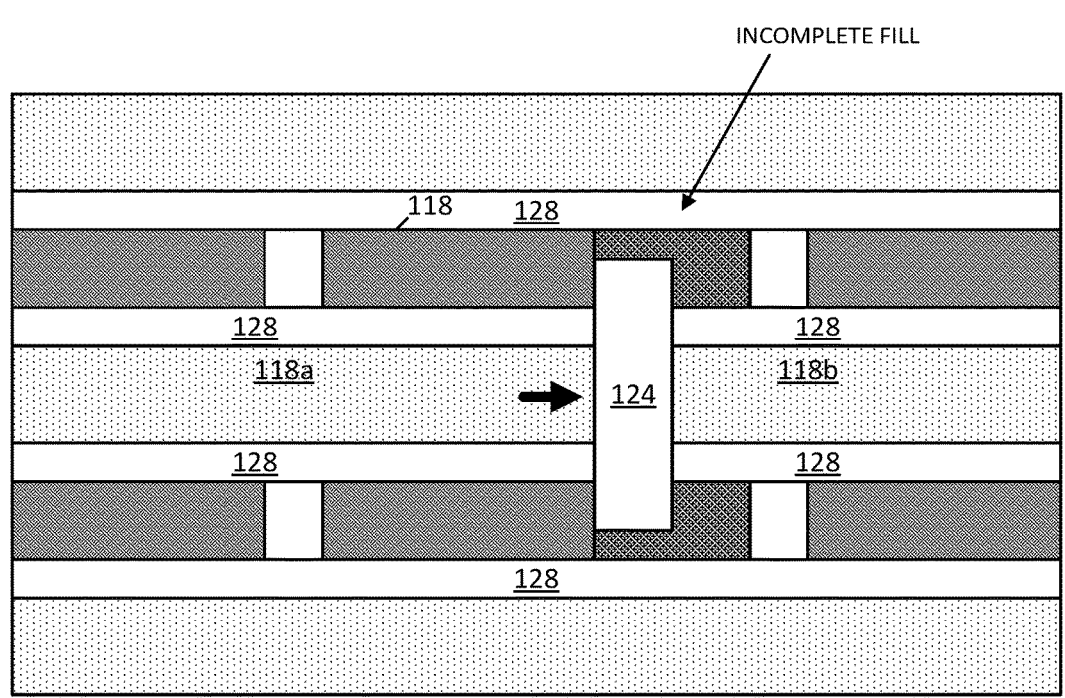

FIG. 1C illustrates a plan view of the integrated circuit showing how gate cut 124 cuts across the gate trench isolating gate electrode 122a from gate electrode 122b. According to some embodiments, the cross-section view in FIG. 1A is taken through the gate trench across plane A-A' while the cross-section view of FIG. 1B is taken through the source/drain region and gate trench across plane B-B'. According to some embodiments, spacer structures 128 extend along the sides of the gate trench and isolate the gate trench from the source/drain trench (including epi regions and their respective contacts). Spacer structures 128 may include any suitable dielectric material, such as silicon nitride. In some embodiments, nanoribbons 104 extend through spacer structures 128 to contact respective source or drain regions 110.

As shown in FIG. 1C, gate cut 124 can extend in the first direction beyond the gate trench, across spacer structures 128 and into portions of one or both source/drain trenches to interrupt conductive contacts 118. Gate cut 124 may partially interrupt a given conductive contact 118, as illustrated, or may extend across the entire source/drain trench in the first direction.

Since gate cut 124 can extend into a portion of the area taken up by conductive contacts 118, it can be difficult to form conductive contacts 118 around gate cut 124. FIG. 1C' illustrates an example situation where gate cut 124 is formed before the formation of conductive contacts 118. Any translation error in the alignment of gate cut 124 (indicated by the arrow) can create a very small space around which to form conductive contact 118, identified in FIG. 1C' as having an incomplete fill. This region may include voids or areas completely devoid of the conductive material for forming conductive contact 118. If gate cut 124 had been formed after the formation of conductive contact 118, the translation error in the alignment of gate cut 124 would not have resulted in a region of incomplete metal fill.

Fabrication Methodology

FIGS. 2A-12A and 2B-12B are cross-sectional views that collectively illustrate an example process for forming an integrated circuit configured with a gate cut formed after the formation of source/drain conductive contacts, in accordance with an embodiment of the present disclosure. FIGS. 2A-12A represent cross-sectional views taken across a gate trench of the integrated circuit, while FIGS. 2B-12B represent cross-sectional views taken across the source/drain trench adjacent to the gate trench along the same direction. Each figure shows an example structure that results from the process flow up to that point in time, so the depicted structure evolves as the process flow continues, culminating in the structure shown in FIGS. 12A and 12B, which is similar to the structure shown in FIGS. 1A and 1B, respectively. Such a structure may be part of an overall integrated circuit (e.g., such as a processor or memory chip) that includes, for example, digital logic cells and/or memory cells and analog mixed signal circuitry. Thus, the illustrated integrated circuit structure may be part of a larger integrated circuit that includes other integrated circuitry not depicted. Example materials and process parameters are given, but the present disclosure is not intended to be limited to any specific such materials or parameters, as will be appreciated. Figures sharing the same number (e.g., FIGS. 2A and 2B) illustrate different views of the structure at the same point in time during the process flow. Although the fabrication of a single gate cut is illustrated in the aforementioned figures, it should be understood that any number of similar gate cuts can be fabricated across the integrated circuit using the same processes discussed herein.

Figure 2A:
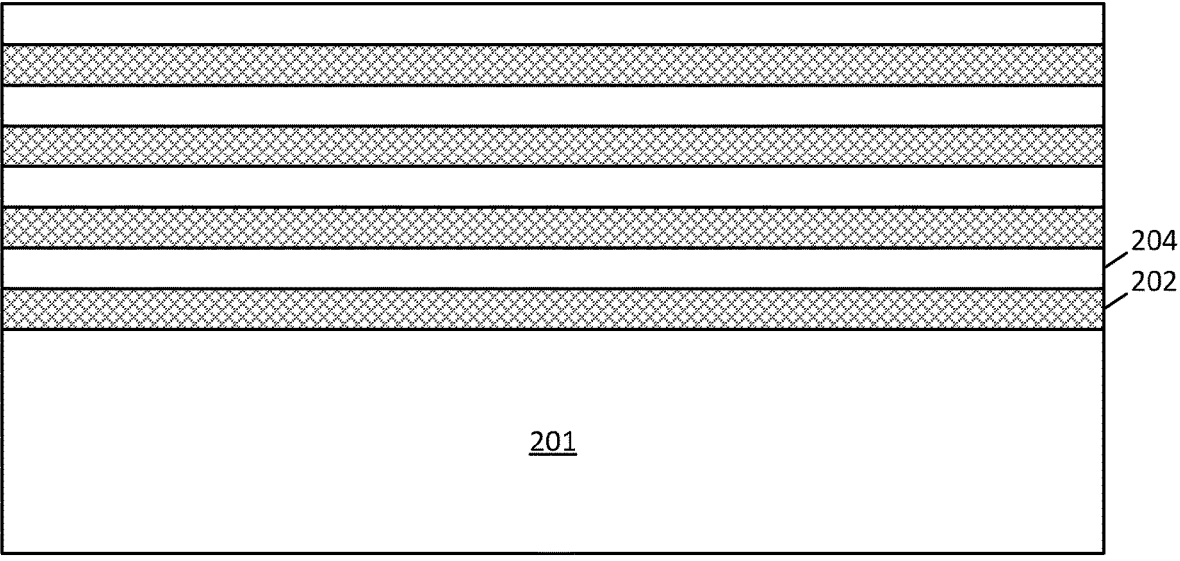
FIGS. 2A and 2B are cross-sectional views that illustrate a stage in an example process for forming semiconductor devices that have a gate cut formed after the source and drain contacts are formed, in accordance with some embodiments of the present disclosure.
Figure 2B:
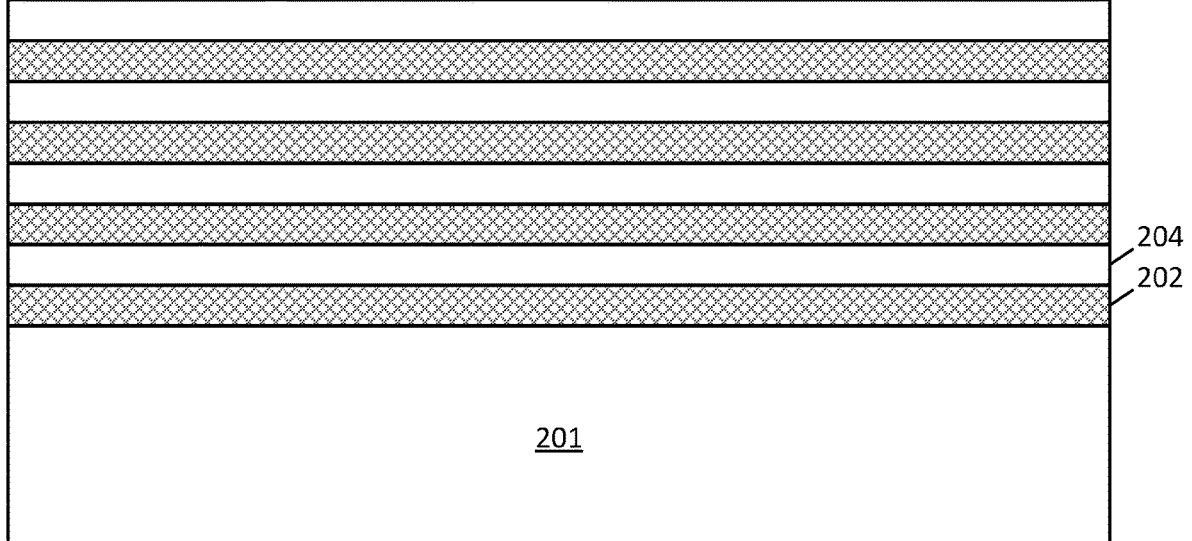

FIGS. 2A and 2B illustrate parallel cross-sectional views taken through a stack of alternating semiconductor layers on a semiconductor substrate 201. FIG. 2A is taken across a portion of the stack that will eventually become a gate trench while FIG. 2B is taken across a portion of the stack that will eventually become a source/drain trench adjacent and parallel to the gate trench. Alternating material layers may be deposited over substrate 201 including sacrificial layers 202 alternating with semiconductor layers 204. The alternating layers are used to form GAA transistor structures. Any number of alternating semiconductor layers 204 and sacrificial layers 202 may be deposited over substrate 201. The description above for substrate 102 applies equally to substrate 201.

According to some embodiments, sacrificial layers 202 have a different material composition than semiconductor layers 204. In some embodiments, sacrificial layers 202 are silicon germanium (SiGe) while semiconductor layers 204 include a semiconductor material suitable for use as a nanoribbon such as silicon (Si), SiGe, germanium, or III-V materials like indium phosphide (InP) or gallium arsenide (GaAs). In examples where SiGe is used in each of sacrificial layers 202 and in semiconductor layers 204, the germanium concentration is different between sacrificial layers 202 and semiconductor layers 204. For example, sacrificial layers 202 may include a higher germanium content compared to semiconductor layers 204. In some examples, semiconductor layers 204 may be doped with either n-type dopants (to produce a p-channel transistor) or p-type dopants (to produce an n-channel transistor).

While dimensions can vary from one example embodiment to the next, the thickness of each sacrificial layer 202 may be between about 5 nm and about 20 nm. In some embodiments, the thickness of each sacrificial layer 202 is substantially the same (e.g., within 1-2 nm). The thickness of each of semiconductor layers 204 may be about the same as the thickness of each sacrificial layer 202 (e.g., about 5-20 nm). Each of sacrificial layers 202 and semiconductor layers 204 may be deposited using any known or proprietary material deposition technique, such as chemical vapor deposition (CVD), plasma-enhanced chemical vapor deposition (PECVD), physical vapor deposition (PVD), or atomic layer deposition (ALD).

Figure 3A:
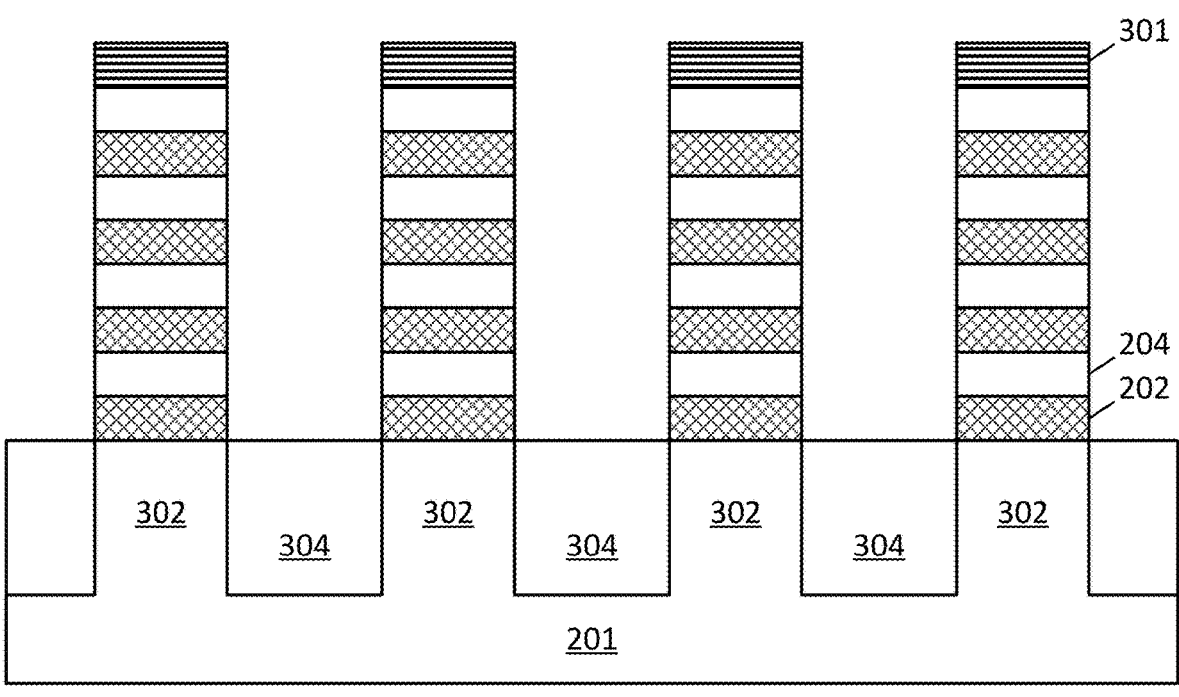
FIGS. 3A and 3B are cross-sectional views that illustrate another stage in the example process for forming semiconductor devices that have a gate cut formed after the source and drain contacts are formed, in accordance with some embodiments of the present disclosure.
Figure 3B:
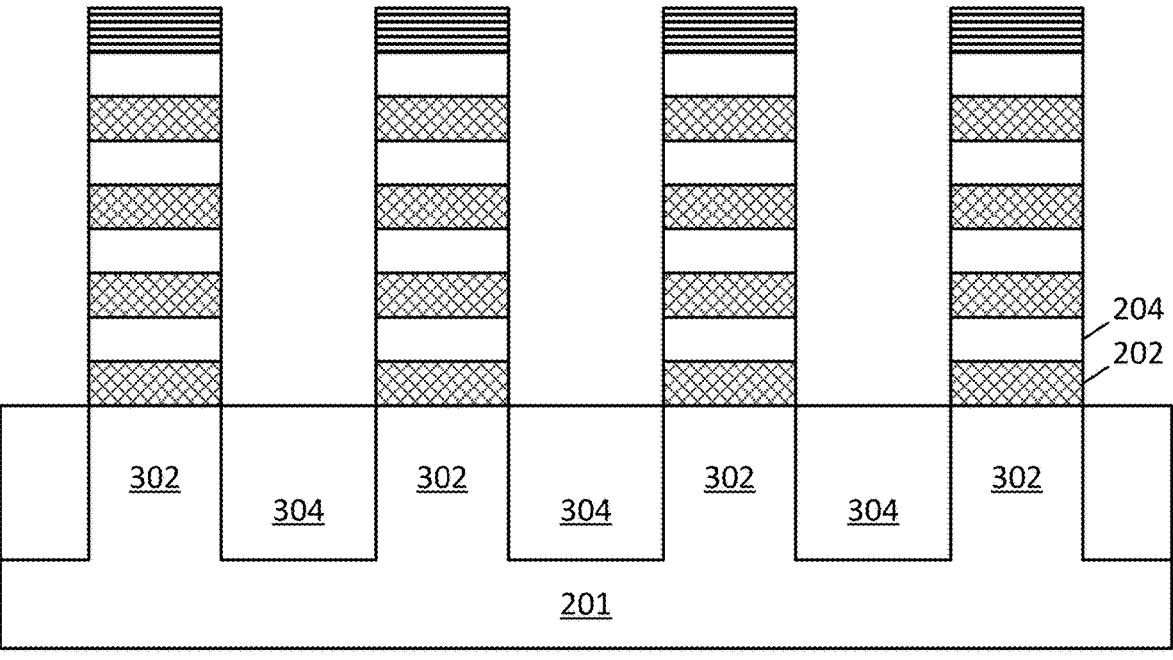

FIGS. 3A and 3B depict the cross-section views of the structure shown in FIGS. 2A and 2B, respectively, following the formation of a cap layer 301 and the subsequent formation of fins beneath cap layer 301, according to an embodiment. Cap layer 301 may be any suitable hard mask material such as a carbon hard mask (CHM) or silicon nitride. Cap layer 301 is patterned into rows to form corresponding rows of fins from the alternating layer stack of sacrificial layers 202 and semiconductor layers 204. The rows of fins extend lengthwise in a first direction (e.g., into and out of the page of each cross-section view).

According to some embodiments, an anisotropic etching process through the layer stack continues into at least a portion of substrate 201, where the unetched portions of substrate 201 beneath the fins form subfin regions 302. The etched portions of substrate 201 may be filled with a dielectric fill 304 that acts as shallow trench isolation (STI) between adjacent fins. Dielectric fill 304 may be any suitable dielectric material such as silicon oxide, and may be recessed to a desired depth as shown (in this example case, down to around the upper surface of the subfins), so as to define the active portion of the fins that will be covered by a gate structure.

Figure 4A:
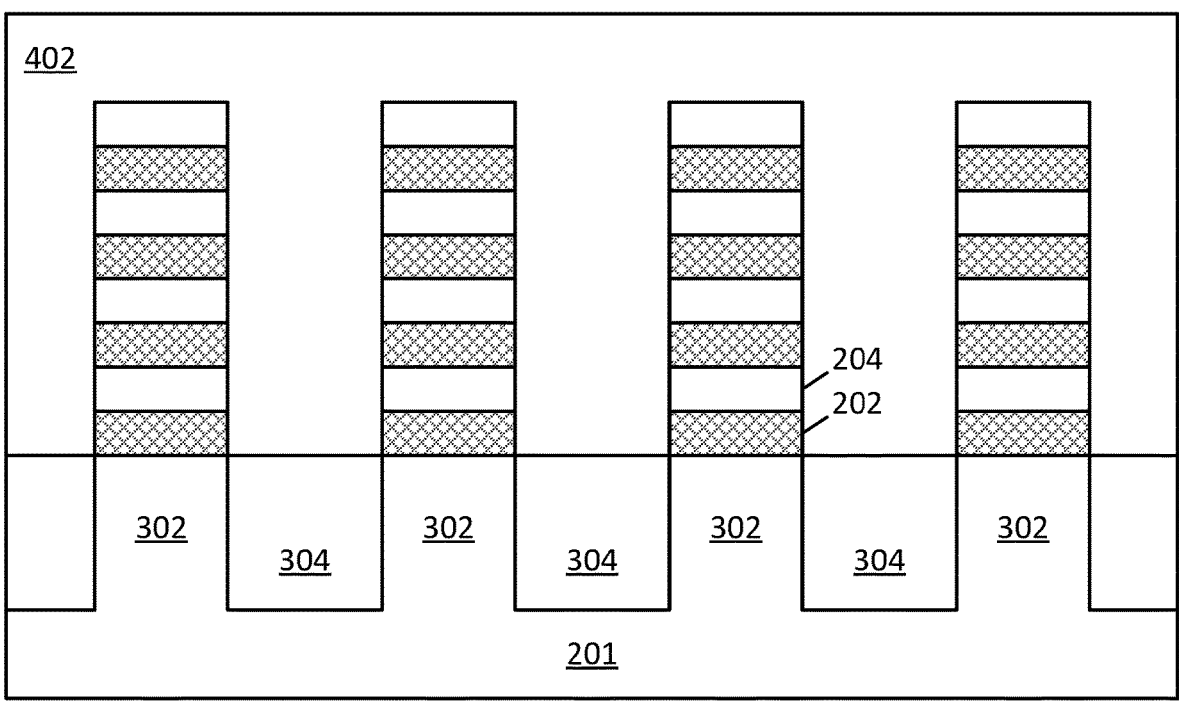
FIGS. 4A and 4B are cross-sectional views that illustrate another stage in the example process for forming semiconductor devices that have a gate cut formed after the source and drain contacts are formed, in accordance with some embodiments of the present disclosure.
Figure 4B:
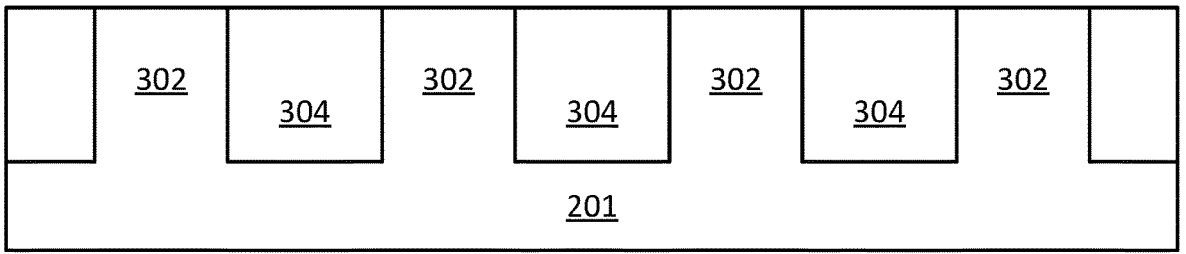

FIGS. 4A and 4B depict the cross-section views of the structure shown in FIGS. 3A and 3B, respectively, following the formation of a sacrificial gate 402 extending across the fins in a second direction different from the first direction, according to some embodiments. Sacrificial gate 402 may extend across the fins in a second direction that is orthogonal to the first direction. According to some embodiments, the sacrificial gate material is formed in parallel strips across the integrated circuit and removed in all areas not protected by a gate masking layer. Sacrificial gate 402 may be any suitable material that can be selectively removed without damaging the semiconductor material of the fins. In some examples, sacrificial gate 402 includes polysilicon.

As seen in the cross-section views, sacrificial gate 402 extends across the fins along the gate trench cross-section of FIG. 4A but is not present along the source/drain trench cross-section of FIG. 4B. Accordingly, sacrificial gate 402 (along with any gate spacers formed on the sidewalls of sacrificial gate 402) protect the underlying portions of the fins while the exposed portions of the fins are etched away as seen in FIG. 4B. According to some embodiments, both semiconductor layers 204 and sacrificial layers 202 are etched at substantially the same rate using an anisotropic RIE process. As observed in FIG. 4B, the fins are completely removed above subfin regions 302. In some embodiments, the RIE process may also etch into subfin regions 302 thus recessing subfin regions 302 beneath a top surface of dielectric fill 304.

Figure 5A:
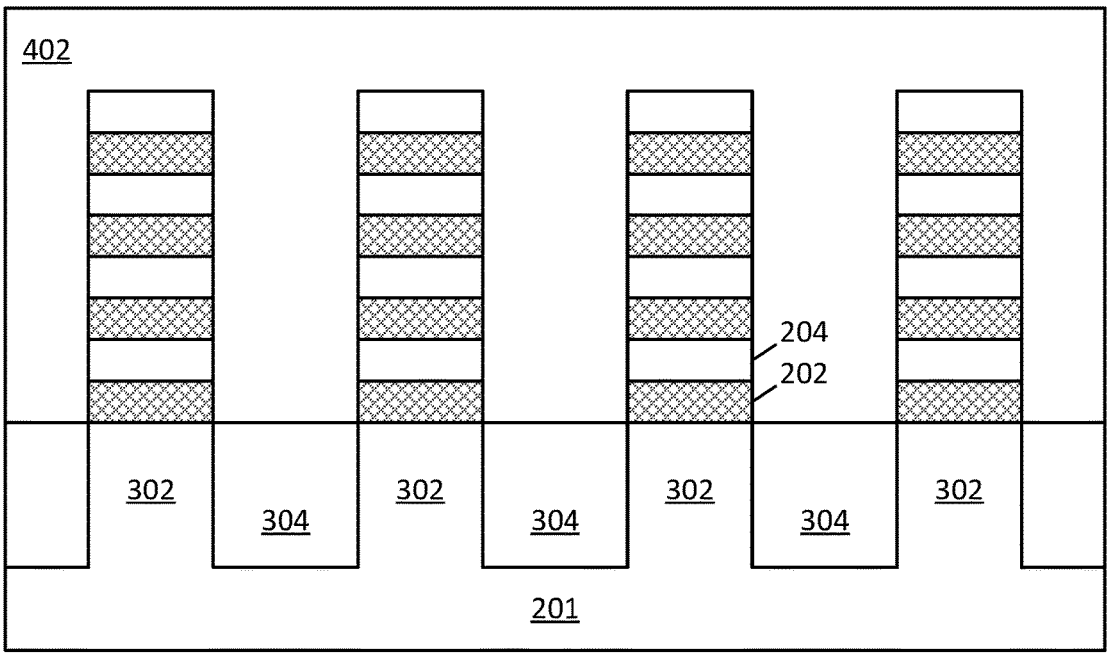
FIGS. 5A and 5B are cross-sectional views that illustrate another stage in the example process for forming semiconductor devices that have a gate cut formed after the source and drain contacts are formed, in accordance with some embodiments of the present disclosure.
Figure 5B:
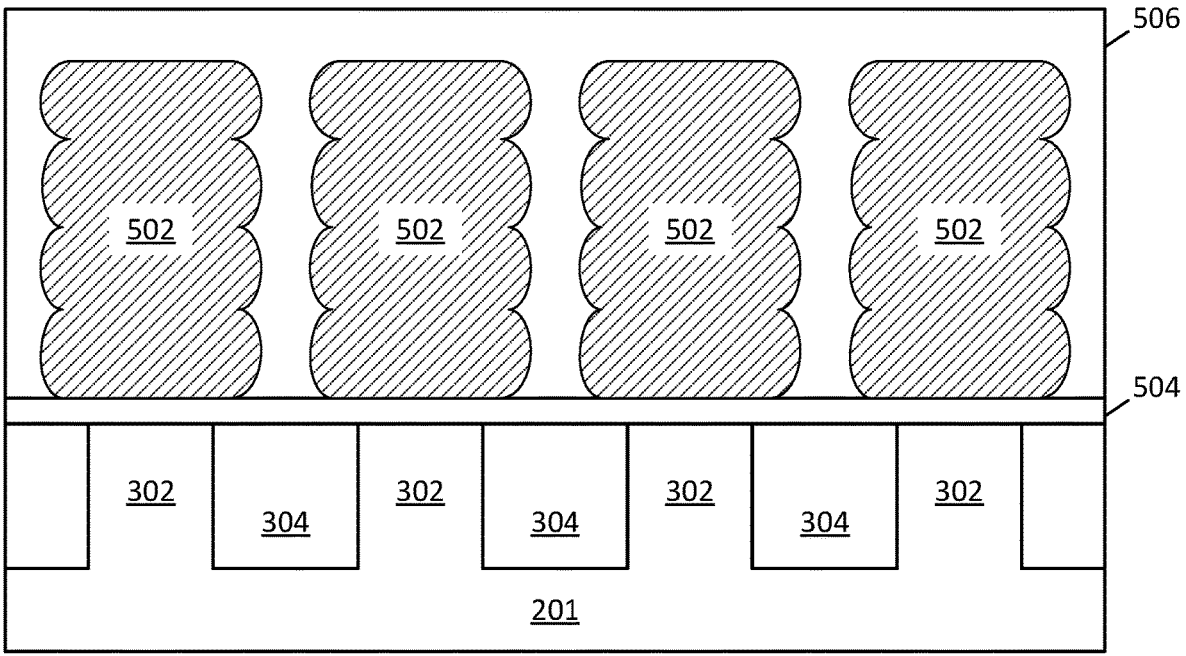

FIGS. 5A and 5B depict the cross-section views of the structure shown in FIGS. 4A and 4B, respectively, following the formation of source or drain regions 502 at the ends of each of the fins (extending into and out of the page in FIG. 5A), according to some embodiments. Source or drain regions 502 may be epitaxially grown from the exposed ends of semiconductor layers 204, such that the material grows together or otherwise merges towards the middle of the trenches between fins, according to some embodiments. Note that epitaxial growth on one semiconductor layer 204 can fully or partially merge with epitaxial growth on one or more other semiconductor layers 204 in the same vertical stack. The degree of any such merging can vary from one embodiment to the next. In the example of a PMOS device, a given source or drain region 502 may be a semiconductor material (e.g., group IV or group III-V semiconductor materials) having a higher dopant concentration of p-type dopants compared to n-type dopants. In the example of an NMOS device, a given source or drain region 502 may be a semiconductor material (e.g., group IV or group III-V semiconductor materials) having a higher dopant concentration of n-type dopants compared to p-type dopants. According to some embodiments, the various source or drain regions 502 grown from different semiconductor devices may be aligned along the second direction as shown in FIG. 5B.

According to some embodiments, a bottom dielectric layer 504 may be deposited prior to the formation of source or drain regions 502. Bottom dielectric layer 504 may be any suitable dielectric material, such as silicon oxide, silicon nitride, or silicon oxynitride. Bottom dielectric layer 504 may be included to provide isolation between source or drain regions 502 and subfin regions 302.

According to some embodiments, another dielectric fill 506 is provided along the source/drain trench. Dielectric fill 506 may extend between adjacent ones of the source or drain regions 502 along the second direction and also may extend up and over each of the source or drain regions 502, according to some embodiments. Accordingly, each source or drain region 502 may be isolated from any adjacent source or drain regions 502 by dielectric fill 506. Dielectric fill 506 may be any suitable dielectric material, although in some embodiments, dielectric fill 506 includes the same dielectric material as dielectric fill 304 or bottom dielectric layer 504. In one example, each of dielectric fill 506, bottom dielectric layer 504, and dielectric fill 304 includes silicon oxide. Dielectric fill 506 may not be present between certain adjacent source or drain regions in situations where the adjacent source or drain regions are desired to be electrically coupled together. According to some embodiments, a top surface of dielectric fill 506 may be polished using, for example, chemical mechanical polishing (CMP). The top surface of dielectric fill 506 may be polished until it is substantially planar with a top surface of sacrificial gate 402. In some embodiments, inner gate spacers can be formed after the source/drain trenches are etched and before the epitaxial deposition is performed. For instance, a selective etch can be used to laterally recess sacrificial layers 202, and that recess can then be filled with inner gate spacer material (e.g., silicon nitride or silicon oxynitride). Any excess gate spacer material can be removed with directional etching.

Figure 6A:
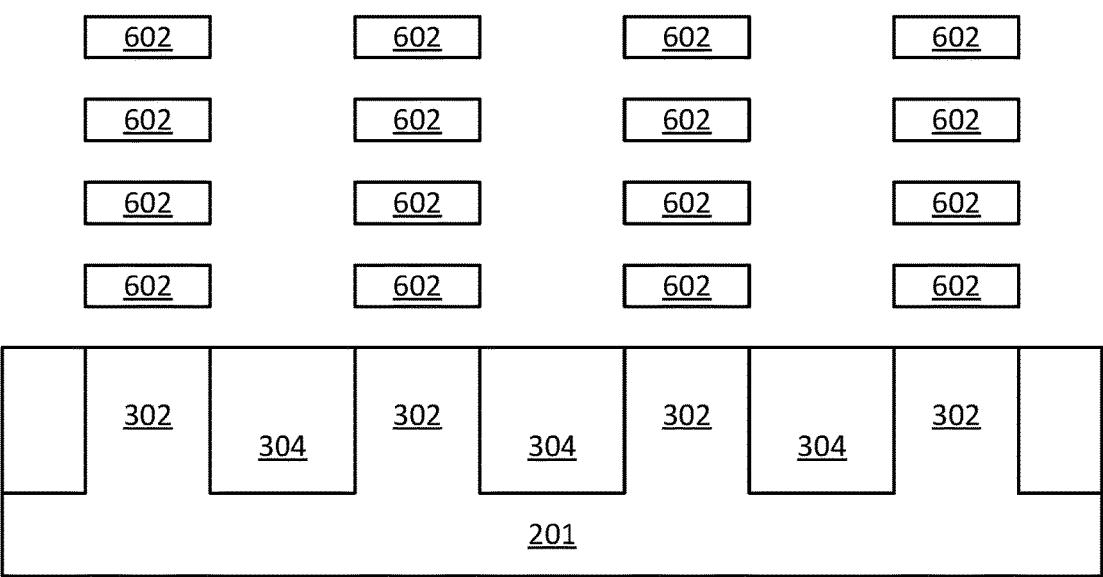
FIGS. 6A and 6B are cross-sectional views that illustrate another stage in the example process for forming semiconductor devices that have a gate cut formed after the source and drain contacts are formed, in accordance with some embodiments of the present disclosure.
Figure 6B:
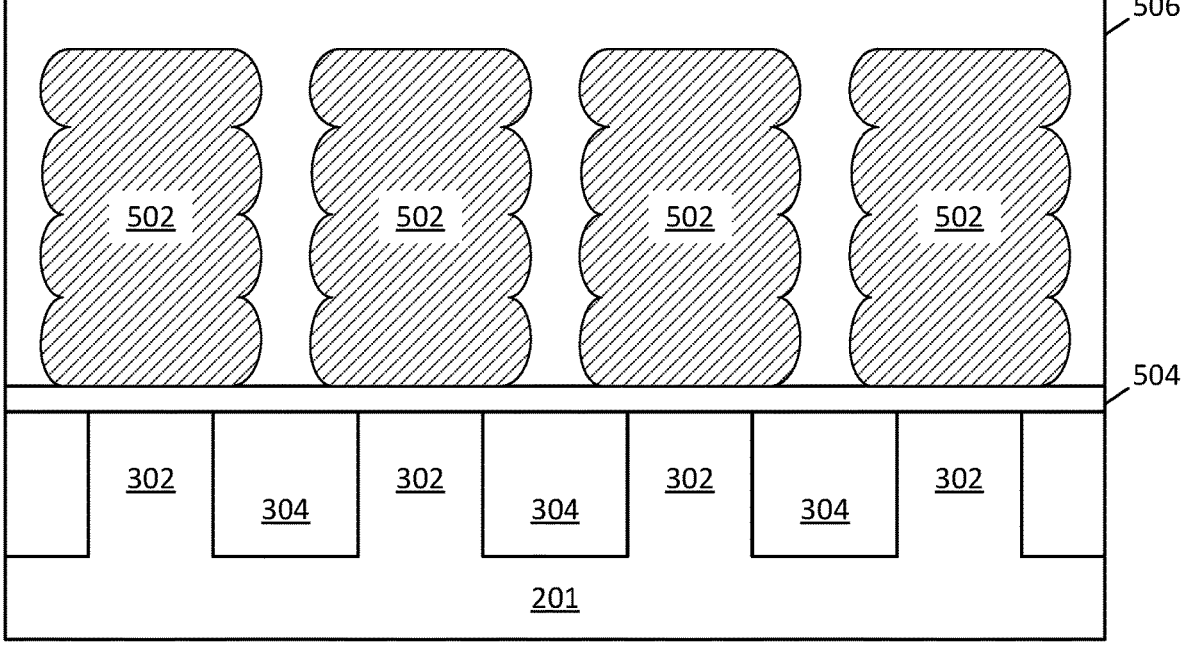

FIGS. 6A and 6B depict the cross-section views of the structure shown in FIGS. 5A and 5B, respectively, following the formation of nanoribbons 602 from semiconductor layers 204, according to some embodiments. Depending on the dimensions of the structures, nanoribbons 602 may also be considered nanowires or nanosheets. Sacrificial gate 402 may be removed using any wet or dry isotropic process thus exposing the alternating layer stack of the fins within the trenches left behind after the removal of sacrificial gate 402. Once sacrificial gate 402 is removed, sacrificial layers 202 may also be removed using a selective isotropic etching process that removes the material of sacrificial layers 202 but does not remove (or removes very little of) semiconductor layers 204 or any other exposed layers (e.g., inner gate spacers). At this point, the suspended (sometimes called released) semiconductor layers 204 form nanoribbons 602 that extend in the first direction (into and out of the page) between a first source or drain region 502 and a second source or drain region on the opposite ends of nanoribbons 602.

Figure 7A:
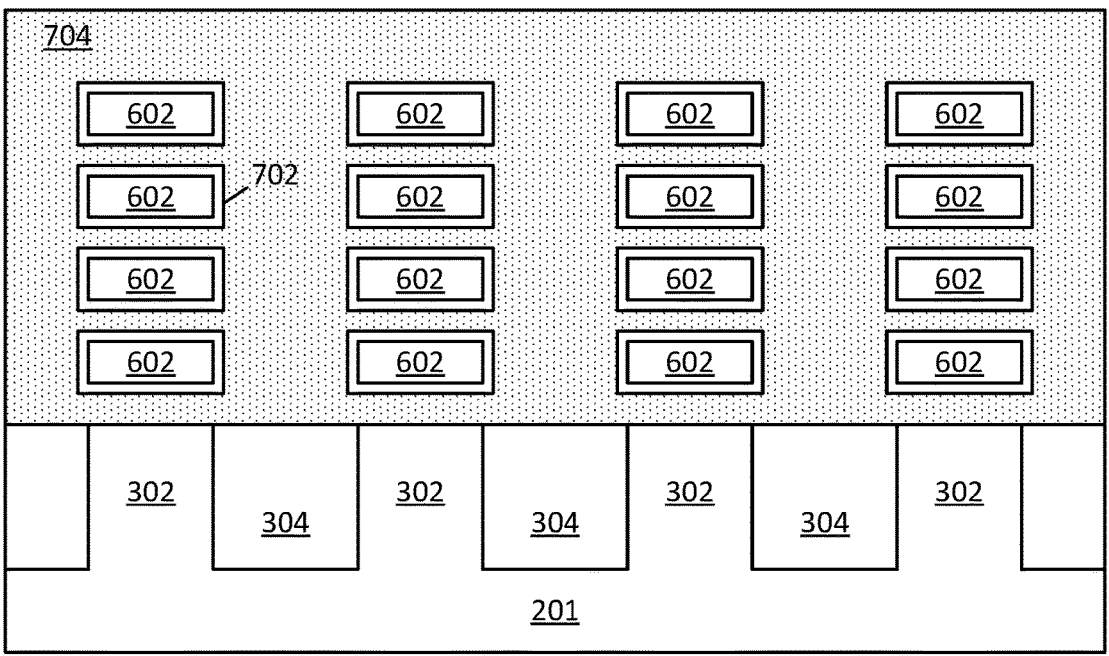
FIGS. 7A and 7B are cross-sectional views that illustrate another stage in the example process for forming semiconductor devices that have a gate cut formed after the source and drain contacts are formed, in accordance with some embodiments of the present disclosure.
Figure 7B:
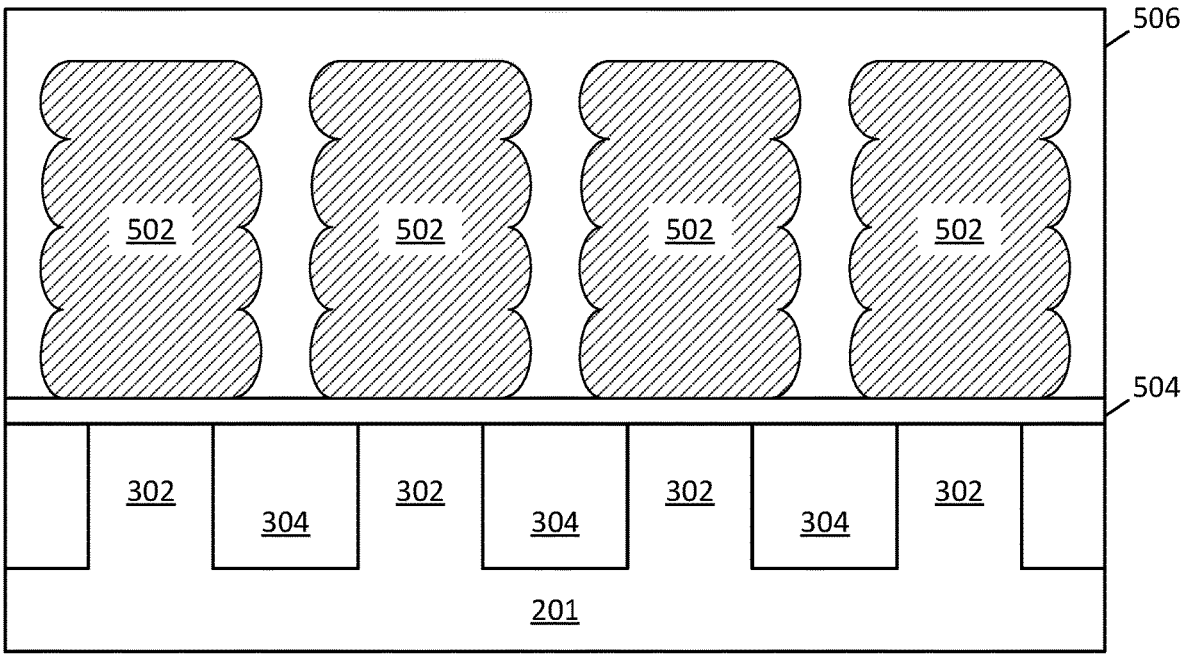

FIGS. 7A and 7B depict the cross-section views of the structure shown in FIGS. 6A and 6B, respectively, following the formation of a gate structure around nanoribbons 602 within the gate trench, according to some embodiments. As noted above, the gate structure includes a gate dielectric 702 and a gate electrode 704. Gate dielectric 702 may be conformally deposited around nanoribbons 602 using any suitable deposition process, such as atomic layer deposition (ALD). Gate dielectric 702 may include any suitable dielectric (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, gate dielectric 702 is hafnium oxide with a thickness between about 1 nm and about 5 nm. In some embodiments, gate dielectric 702 may include one or more silicates (e.g., titanium silicate, tungsten silicate, niobium silicate, and silicates of other transition metals). Gate dielectric 702 may be a multilayer structure, in some examples. For instance, gate dielectric 702 may include a first layer on nanoribbons 602, and a second layer on the first layer. The first layer can be, for instance, an oxide of the semiconductor layers (e.g., silicon dioxide) and the second layer can be a high-k dielectric material (e.g., hafnium oxide). In some embodiments, an annealing process may be carried out on gate dielectric 702 to improve its quality when a high-k dielectric material is used. In some embodiments, the high-k material can be nitridized to improve its aging resistance.

Gate electrode 704 may be deposited over gate dielectric 702 and can be any standard or proprietary conductive structure. In some embodiments, gate electrode 704 includes doped polysilicon, a metal, or a metal alloy. Example suitable metals or metal alloys include aluminum, tungsten, cobalt, molybdenum, ruthenium, titanium, tantalum, copper, and carbides and nitrides thereof. Gate electrode 704 may include, for instance, one or more workfunction layers, resistance-reducing layers, and/or barrier layers. The workfunction layers can include, for example, p-type workfunction materials (e.g., titanium nitride) for PMOS gates, or n-type workfunction materials (e.g., titanium aluminum carbide) for NMOS gates.

Figure 8A:
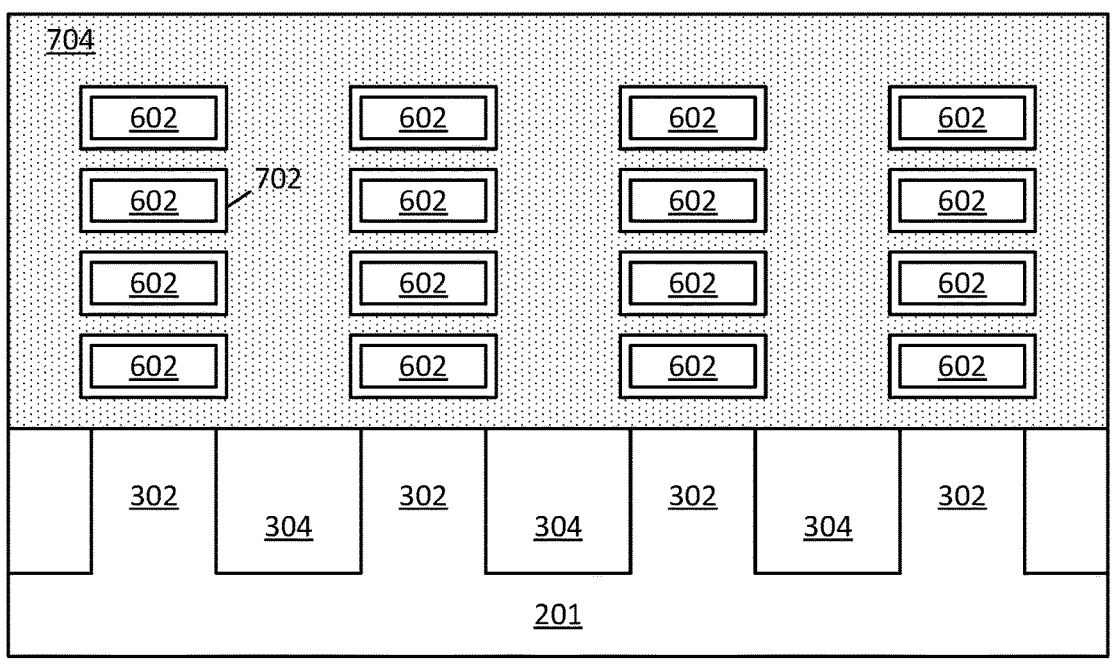
FIGS. 8A and 8B are cross-sectional views that illustrate another stage in the example process for forming semiconductor devices that have a gate cut formed after the source and drain contacts are formed, in accordance with some embodiments of the present disclosure.
Figure 8B:
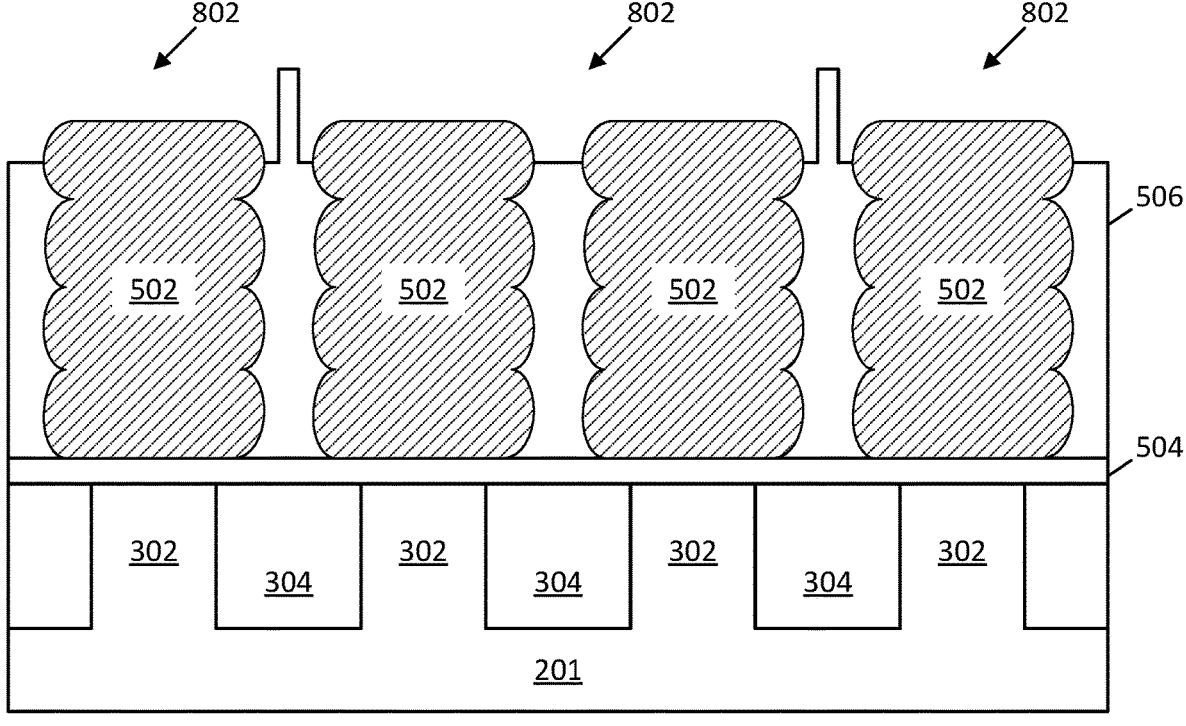

FIGS. 8A and 8B depict the cross-section views of the structure shown in FIGS. 7A and 7B, respectively, following the formation of contact recesses 802 through dielectric fill 506, according to some embodiments. Contact recesses 802 may be formed in locations where conductive contacts are to be later formed. In some embodiments, a contact recess 802 is formed over only one source or drain region 502. In some embodiments, a contact recess 802 may be formed across more than one source or drain region 502, such as the central illustrated contact recess 802. According to some embodiments, contact recesses 802 are etched using an isotropic etching process that selectively etches the material of dielectric fill 506 as opposed to the material of source or drain regions 502. Contact recesses 802 may be etched deep enough to expose at least a top surface of source or drain regions 502, and in some cases are etched deeper to expose side surfaces of source or drain regions 502.

Figure 9A:
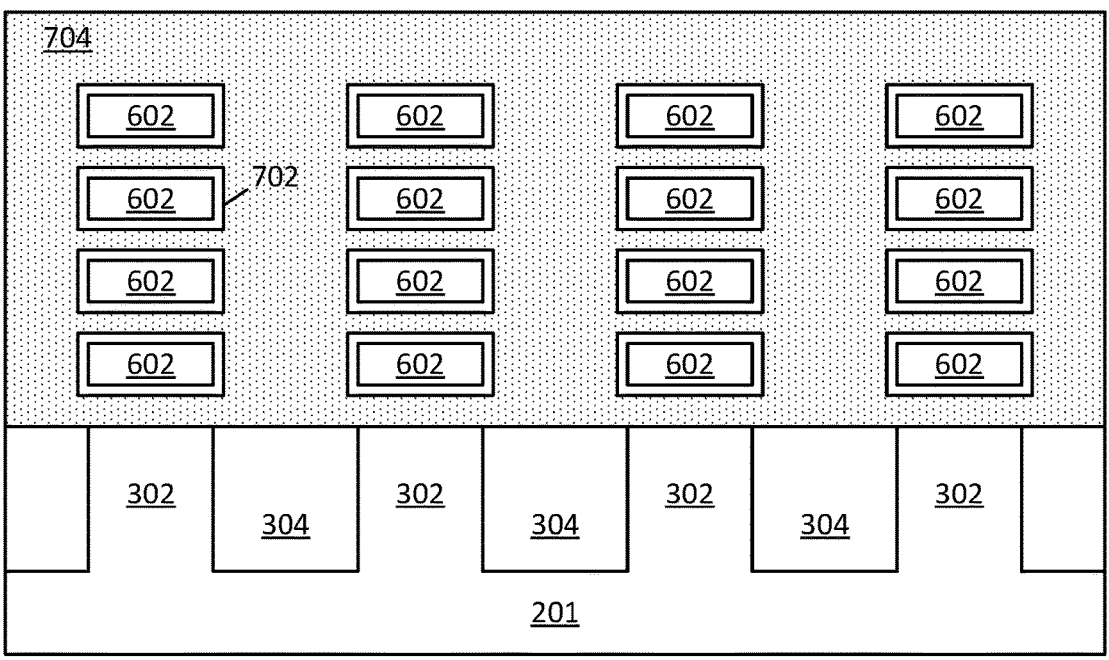
FIGS. 9A and 9B are cross-sectional views that illustrate another stage in the example process for forming semiconductor devices that have a gate cut formed after the source and drain contacts are formed, in accordance with some embodiments of the present disclosure.
Figure 9B:
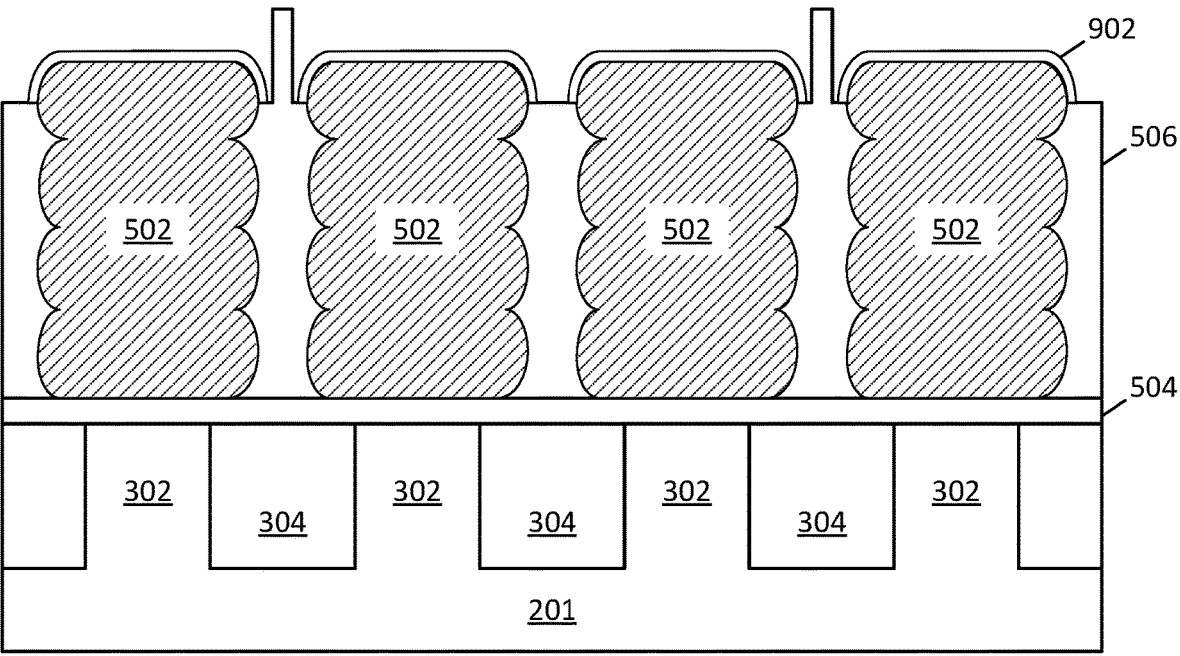

FIGS. 9A and 9B depict the cross-section views of the structure shown in FIGS. 8A and 8B, respectively, following the formation of a liner structure 902 on at least the exposed surfaces of source or drain regions 502, according to some embodiments. Liner structure 902 may also form on any other exposed surfaces, such as on exposed surfaces of dielectric fill 506 within the source/drain trench.

Liner structure 902 may include any number of conductive layers that improve the performance of the device. For example, liner structure 902 may include a first conductive layer that includes a titanium-based material, such as titanium nitride, titanium silicide, or titanium germano-silicide, and a second conductive layer that includes a combination of tungsten, carbon, and nitrogen. The first layer may provide an enhanced ohmic contact between source or drain region 502 and any conductive contact formed on liner structure 902, while the second layer may provide better adhesion for any conductive contact formed on liner structure 902. Still other material layers may be used in liner structure 902 that include silicon and nitrogen in various concentrations. Liner structure 902 may have a total thickness, for example, between about 2 nm and about 20 nm, such as between about 5 nm and about 15 nm or between about 7 nm and about 12 nm. In one such example, the liner structure 902 includes a first conductive layer of titanium-based material (e.g., titanium nitride, titanium silicide, or titanium germano-silicide) and a second conductive layer that includes a combination of tungsten, carbon and nitrogen, and the overall thickness of the liner structure 902 is between about 5 nm and about 15 nm or between about 7 nm and about 12 nm.

Figure 10A:
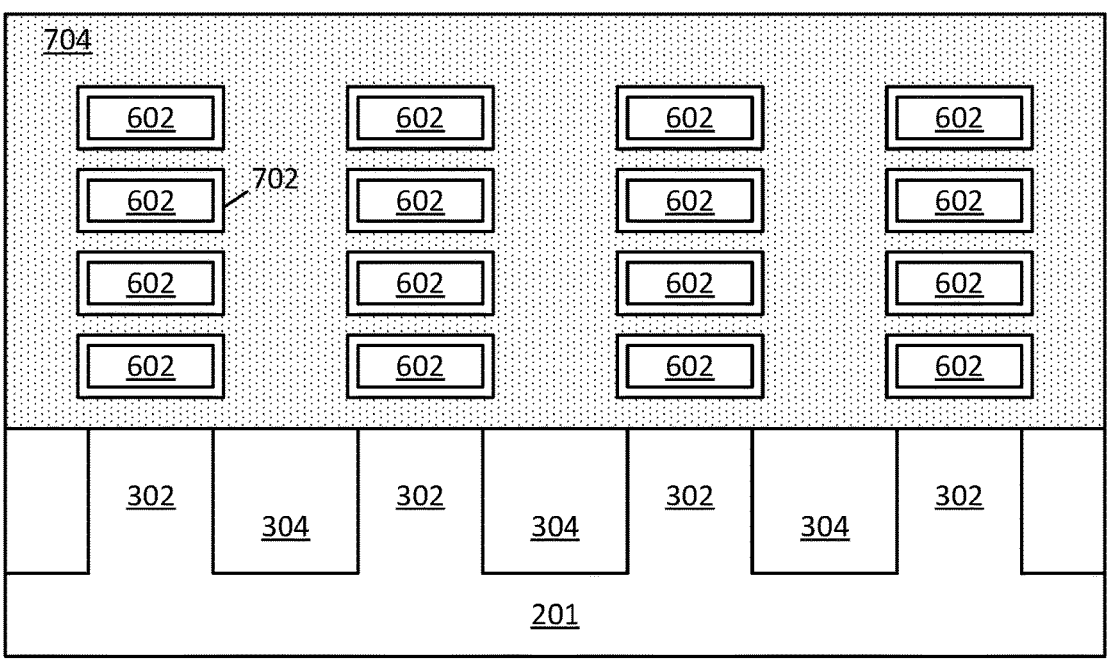
FIGS. 10A and 10B are cross-sectional views that illustrate another stage in the example process for forming semiconductor devices that have a gate cut formed after the source and drain contacts are formed, in accordance with some embodiments of the present disclosure.
Figure 10B:
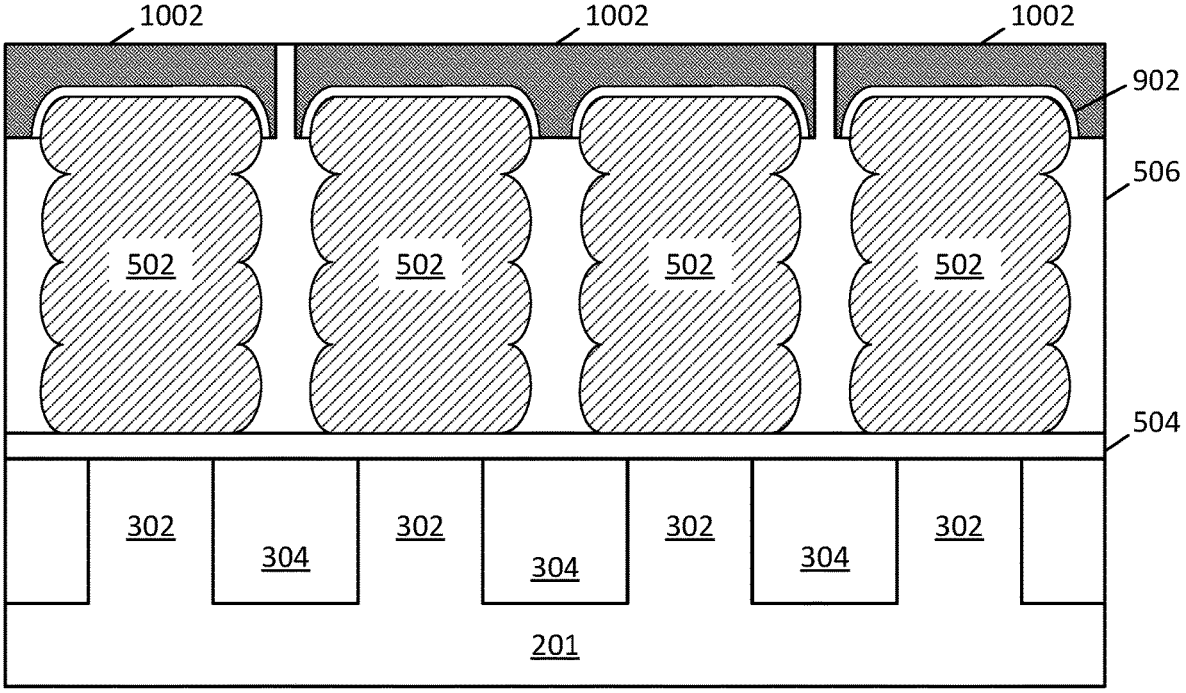

FIGS. 10A and 10B depict the cross-section views of the structure shown in FIGS. 9A and 9B, respectively, following the formation of conductive contacts 1002 within the contact recesses 802, according to some embodiments. Conductive contacts 1002 may be formed directly on liner structure 902 such that a conductive pathway exists between a given conductive contact 1002 and its respective source or drain region 502 via liner structure 902. Conductive contacts 118 may be any suitably conductive material such as tungsten (W). Other conductive materials may include copper (Cu), ruthenium (Ru), cobalt (Co), titanium (Ti), molybdenum (Mo), or any alloys thereof. Note that in the absence of any gate cut structure interrupting the source/drain trench, conductive contracts 1002 are able to form without hinderance within contact recesses 802.

Figure 11A:
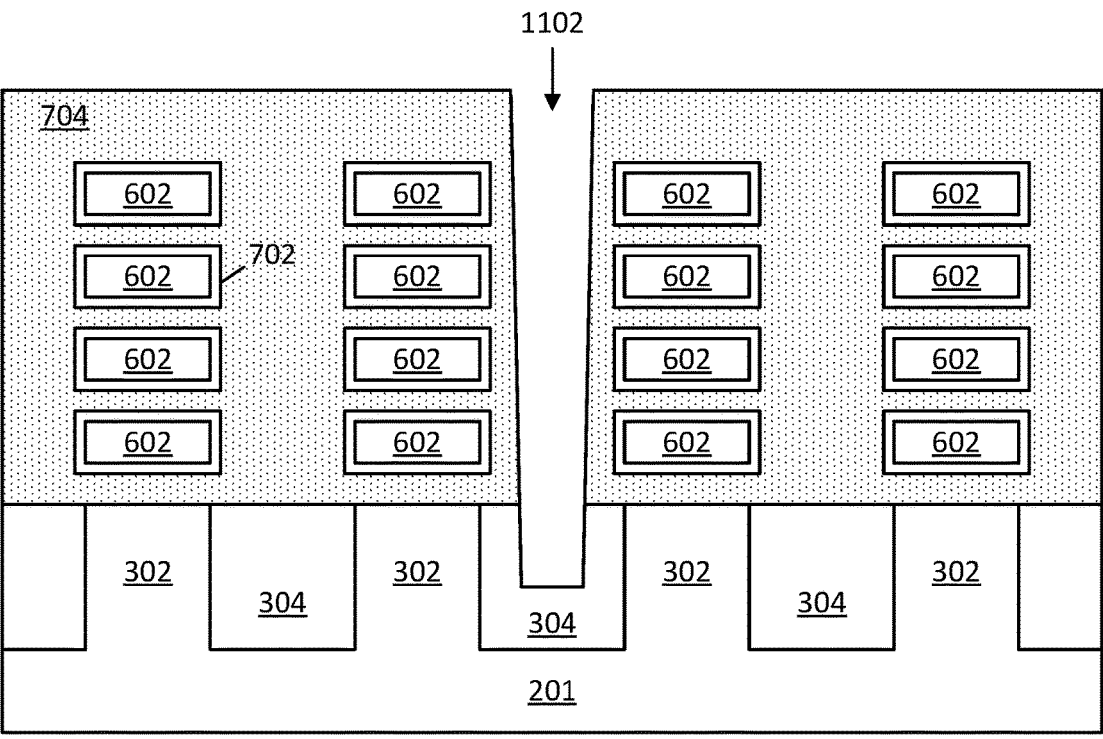
FIGS. 11A and 11B are cross-sectional views that illustrate another stage in the example process for forming semiconductor devices that have a gate cut formed after the source and drain contacts are formed, in accordance with some embodiments of the present disclosure.
Figure 11B:
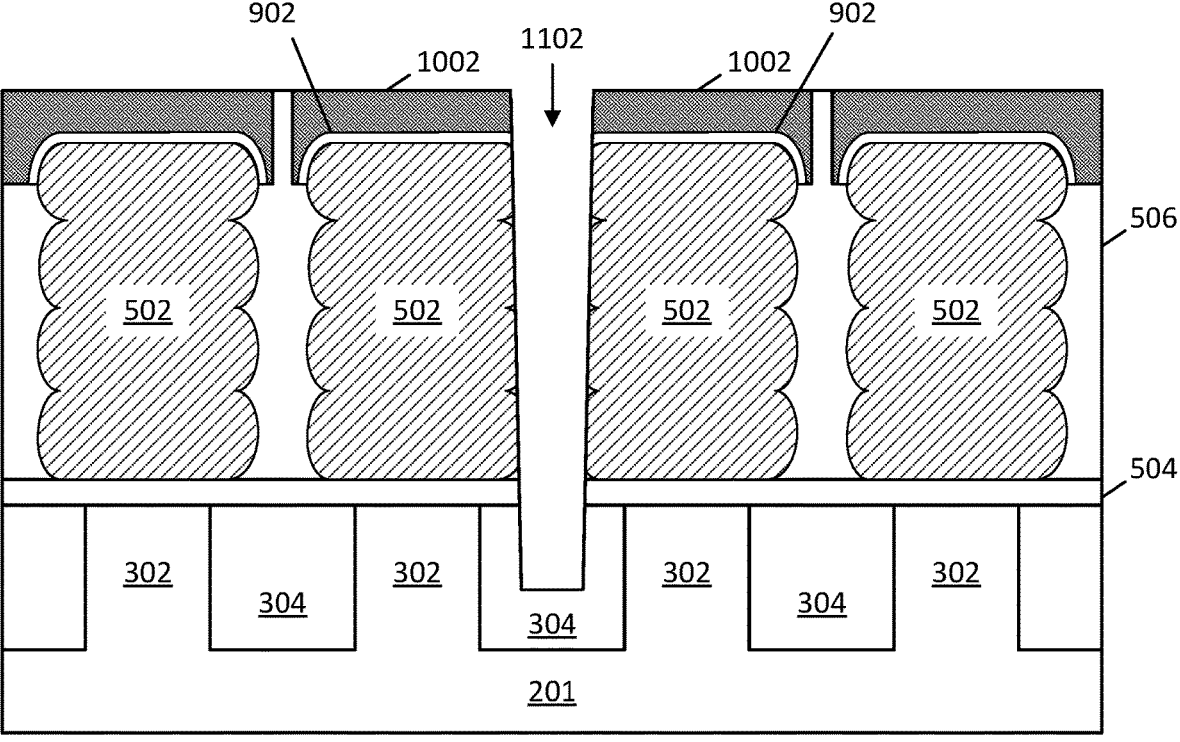

FIGS. 11A and 11B depict the cross-section views of the structure shown in FIGS. 10A and 10B, respectively, following the formation of a gate cut recess 1102 through a thickness of the gate structure, according to some embodiments. Gate cut recess 1102 may be formed using a metal gate etch process that iteratively etches through portions of gate electrode 704 while simultaneously protecting the sidewalls of the recess from lateral etching to provide a high height-to-width aspect ratio final gate cut recess 1102 (e.g., aspect ratio of 5:1 or higher, or 10:1 or higher). Gate cut recess 1102 may extend into at least a portion of dielectric fill 304 or even deeper into a portion of the underlying substrate 201.

According to some embodiments, gate cut recess 1102 extends in the first direction (e.g., into and out of the page) and may extend into the source/drain trench such that it cuts across at least a portion of a conductive contact 1002 as shown in FIG. 11B. Due to the closeness of the devices, gate cut recess 1102 may also expose portions of source or drain regions 502.

Figure 12A:
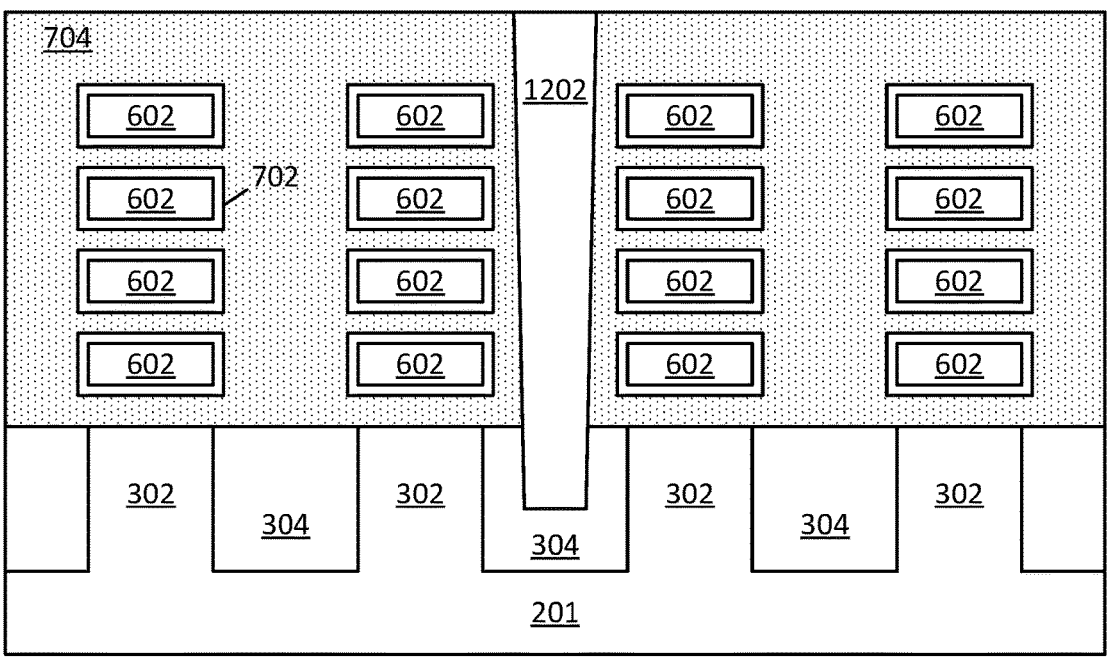
FIGS. 12A and 12B are cross-sectional views that illustrate another stage in the example process for forming semiconductor devices that have a gate cut formed after the source and drain contacts are formed, in accordance with some embodiments of the present disclosure.
Figure 12B:
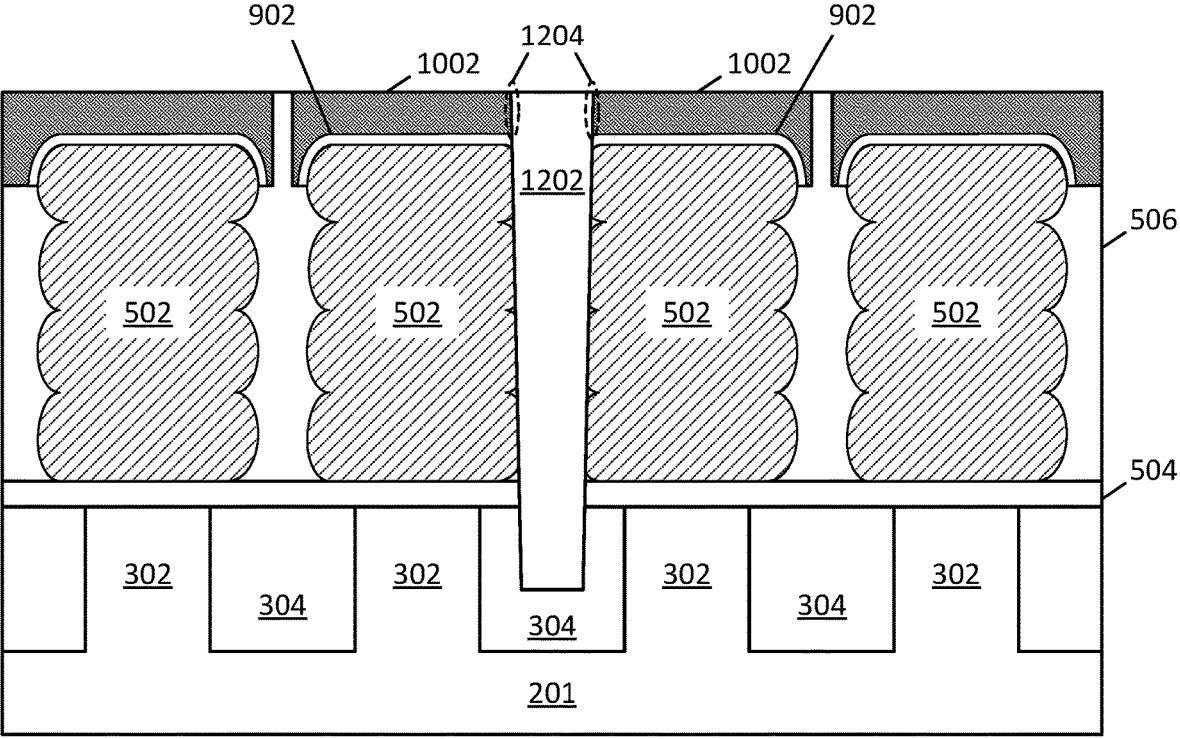

FIGS. 12A and 12B depict the cross-section views of the structure shown in FIGS. 11A and 11B, respectively, following the formation of a gate cut 1202, according to some embodiments. Gate cut 1202 may include one or more dielectric materials within the volume of gate cut recess 1102. Gate cut 1202 may include only silicon oxide or silicon nitride or silicon carbide. In some examples, gate cut 1202 includes a first dielectric layer deposited first and a second dielectric layer or dielectric fill formed on the first dielectric layer. The first dielectric layer may include a high-k dielectric material (e.g., materials with a dielectric constant higher than that of silicon oxide or higher than 3.9) while the second dielectric layer may include a low-k dielectric material (e.g., materials with a dielectric constant equal to or lower than that of silicon oxide, such as porous silicon oxide, or equal to or lower than 3.9).

Since gate cut 1202 is formed after the formation of conductive contact 1002, an end surface of the liner structure 902 abuts a portion of gate cut 1202, but the liner structure 902 does not extend any further up or down the sidewall of gate cut 1202 (because liner structure 902 was deposited before gate cut 1202). In some examples, conductive contact 1002 directly contacts sidewall portions 1204 of gate cut 1202 (e.g., with no liner structure 902 between them). Additionally, since gate cut 1202 is formed after the formation of the gate structure, gate dielectric 702 is also not present along any sidewall of gate cut 1202 within the gate trench.

Figure 13:
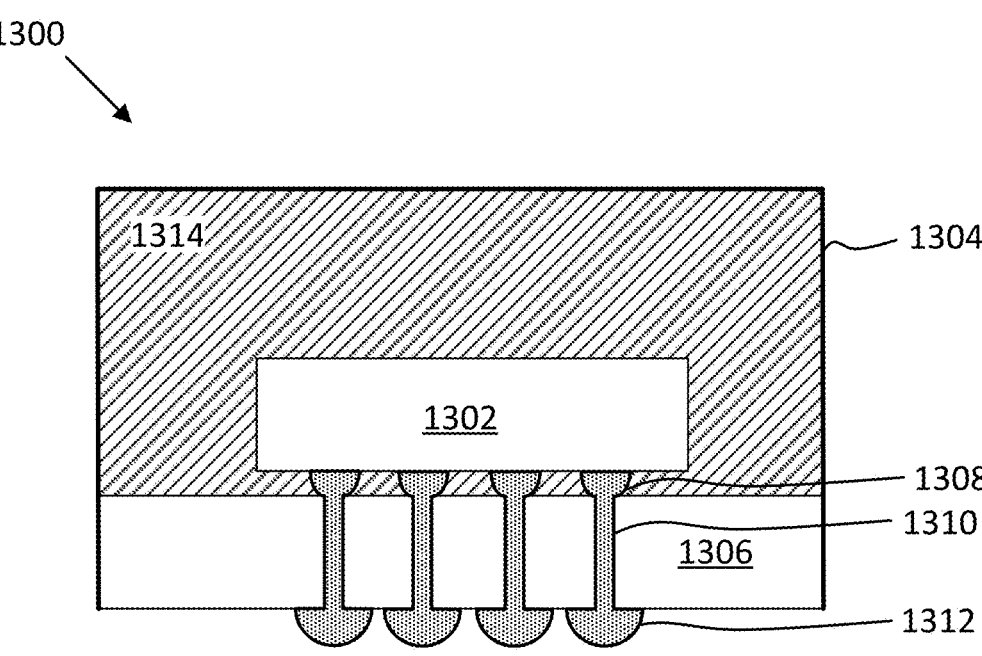
FIG. 13 illustrates a cross-sectional view of a chip package containing one or more semiconductor dies, in accordance with some embodiments of the present disclosure.

FIG. 13 illustrates an example embodiment of a chip package 1300, in accordance with an embodiment of the present disclosure. As can be seen, chip package 1300 includes one or more dies 1302. One or more dies 1302 may include at least one integrated circuit having semiconductor devices, such as any of the semiconductor devices disclosed herein. One or more dies 1302 may include any other circuitry used to interface with other devices formed on the dies, or other devices connected to chip package 1300, in some example configurations.

As can be further seen, chip package 1300 includes a housing 1304 that is bonded to a package substrate 1306. The housing 1304 may be any standard or proprietary housing, and may provide, for example, electromagnetic shielding and environmental protection for the components of chip package 1300. The one or more dies 1302 may be conductively coupled to a package substrate 1306 using connections 1308, which may be implemented with any number of standard or proprietary connection mechanisms, such as solder bumps, ball grid array (BGA), pins, or wire bonds, to name a few examples. Package substrate 1306 may be any standard or proprietary package substrate, but in some cases includes a dielectric material having conductive pathways (e.g., including conductive vias and lines) extending through the dielectric material between the faces of package substrate 1306, or between different locations on each face. In some embodiments, package substrate 1306 may have a thickness less than 1 millimeter (e.g., between 0.1 millimeters and 0.5 millimeters), although any number of package geometries can be used. Additional conductive contacts 1312 may be disposed at an opposite face of package substrate 1306 for conductively contacting, for instance, a printed circuit board (PCB). One or more vias 1310 extend through a thickness of package substrate 1306 to provide conductive pathways between one or more of connections 1308 to one or more of contacts 1312. Vias 1310 are illustrated as single straight columns through package substrate 1306 for ease of illustration, although other configurations can be used (e.g., damascene, dual damascene, through-silicon via, or an interconnect structure that meanders through the thickness of substrate 1306 to contact one or more intermediate locations therein). In still other embodiments, vias 1310 are fabricated by multiple smaller stacked vias, or are staggered at different locations across package substrate 1306. In the illustrated embodiment, contacts 1312 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 1312, to inhibit shorting.

In some embodiments, a mold material 1314 may be disposed around the one or more dies 1302 included within housing 1304 (e.g., between dies 1302 and package substrate 1306 as an underfill material, as well as between dies 1302 and housing 1304 as an overfill material). Although the dimensions and qualities of the mold material 1314 can vary from one embodiment to the next, in some embodiments, a thickness of mold material 1314 is less than 1 millimeter. Example materials that may be used for mold material 1314 include epoxy mold materials, as suitable. In some cases, the mold material 1314 is thermally conductive, in addition to being electrically insulating.

Methodology

Figure 14:
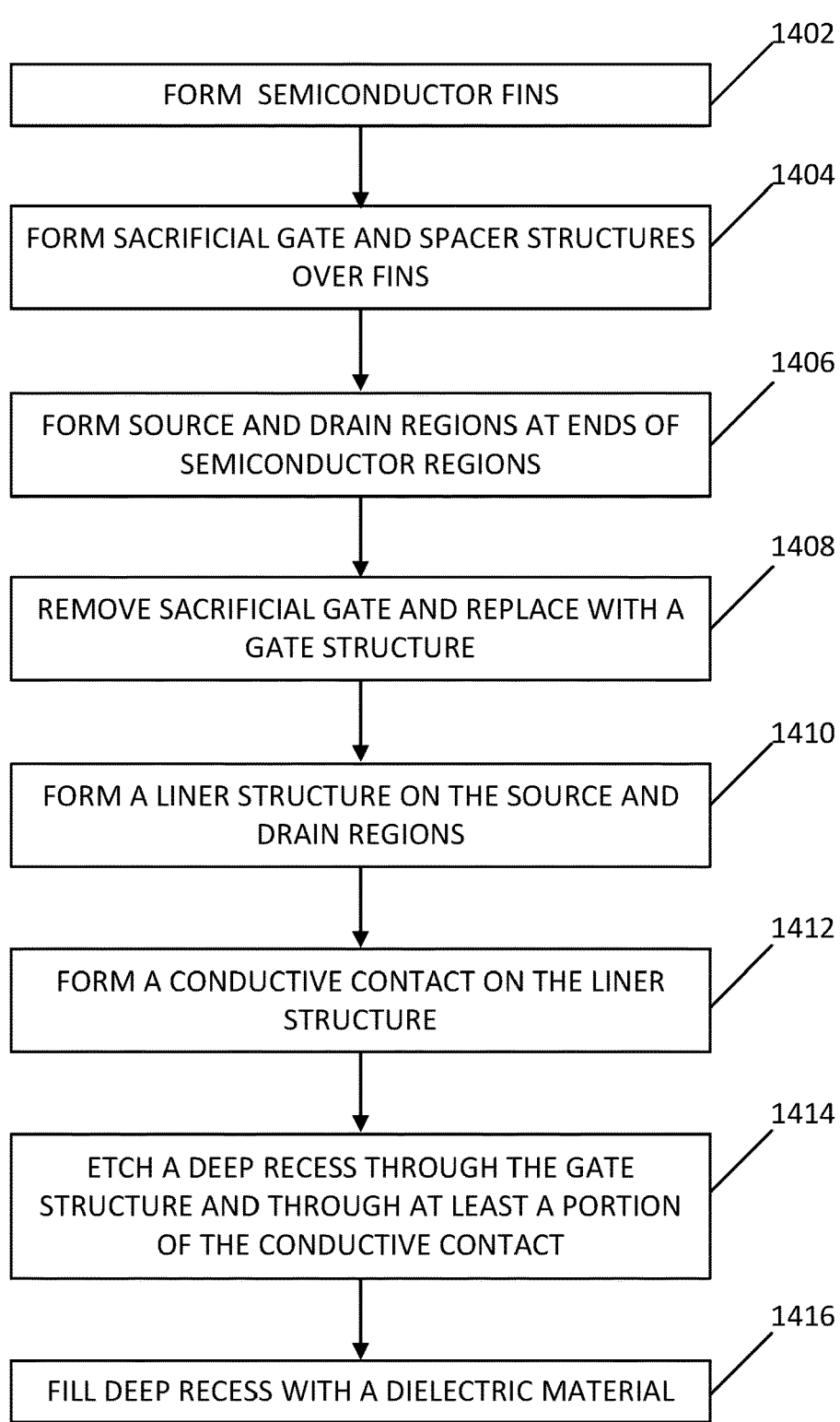
FIG. 14 is a flowchart of a fabrication process for semiconductor devices having a gate cut between devices formed after the source and drain contacts are formed, in accordance with an embodiment of the present disclosure.

FIG. 14 is a flow chart of a method 1400 for forming at least a portion of an integrated circuit, according to an embodiment. Various operations of method 1400 may be illustrated in FIGS. 2A-12A and FIGS. 2B-12B. However, the correlation of the various operations of method 1400 to the specific components illustrated in the aforementioned figures is not intended to imply any structural and/or use limitations. Rather, the aforementioned figures provide one example embodiment of method 1400. Other operations may be performed before, during, or after any of the operations of method 1400. For example, method 1400 does not explicitly describe all processes that are performed to form common transistor structures. Some of the operations of method 1400 may be performed in a different order than the illustrated order.

Method 1400 begins with operation 1402 where a plurality of parallel semiconductor fins are formed, according to some embodiments. The semiconductor material in the fins may be formed from a substrate such that the fins are an integral part of the substrate (e.g., etched from a bulk silicon substrate). Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around (GAA) process can then be carried out. The alternating layers can be blanket deposited and then etched into fins, or deposited into fin-shaped trenches. The fins may also include a cap structure over each fin that is used to define the locations of the fins during, for example, an RIE process. The cap structure may be a dielectric material, such as silicon nitride.

According to some embodiments, a dielectric fill is formed around subfin portions of the one or more fins. In some embodiments, the dielectric fill extends between each pair of adjacent parallel fins and runs lengthwise in the same direction as the fins. In some embodiments, the anisotropic etching process that forms the fins also etches into a portion of the substrate and the dielectric fill may be formed within the recessed portions of the substrate. Accordingly, the dielectric fill acts as shallow trench isolation (STI) between adjacent fins. The dielectric fill may be any suitable dielectric material, such as silicon oxide.

Method 1400 continues with operation 1404 where a sacrificial gate and spacer structures are formed over the fins. The sacrificial gate may be patterned using a gate masking layer in a strip that runs orthogonally over the fins (many gate masking layers and corresponding sacrificial gates may be formed parallel to one another (e.g., forming a cross-hatch pattern with the fins). The gate masking layer may be any suitable hard mask material, such as CHM or silicon nitride. The sacrificial gate may be formed from any suitable material that can be selectively removed at a later time without damaging the semiconductor material of the fins. In one example, the sacrificial gate includes polysilicon. The spacer structures may be deposited and then etched back such that the spacer structures remain mostly only on sidewalls of any exposed structures, such as on sidewalls of the sacrificial gate. According to some embodiments, the spacer structures may be any suitable dielectric material, such as silicon nitride or silicon oxynitride.

Method 1400 continues with operation 1406 where source or drain regions are formed at the ends of the semiconductor regions of each of the fins. Any portions of the fins not protected by the sacrificial gate and spacer structures may be removed using, for example, an anisotropic etching process followed by the epitaxial growth of the source or drain regions from the exposed ends of the semiconductor layers in the fins. In some example embodiments, the source or drain regions are NMOS source or drain regions (e.g., epitaxial silicon) or PMOS source or drain regions (e.g., epitaxial SiGe). Another dielectric fill may be formed adjacent to the various source or drain regions for additional electrical isolation between adjacent regions. The dielectric fill may also extend over a top surface of the source or drain regions. In some embodiments, topside conductive contacts may be formed through the dielectric fill to contact one or more of the source or drain regions. As described above, internal gate spacers may be formed during the source drain processing (e.g., after source drain recess but prior to epi growth of source/drain regions, using a lateral etch process that selectively recesses sacrificial material of the channel region and then filling that recess with internal gate spacer material).

Method 1400 continues with operation 1408 where the sacrificial gate is removed and replaced with a gate structure. The sacrificial gate may be removed using an isotropic etching process that selectively removes all of the material from the sacrificial gate, thus exposing the various fins between the set of spacer structures. In the example case where GAA transistors are used, any sacrificial layers within the exposed fins between the spacer structures may also be removed to release nanoribbons, nanosheets, or nanowires of semiconductor material.

The gate structure may include both a gate dielectric and a gate electrode. The gate dielectric is first formed over the exposed semiconductor regions between the spacer structures followed by forming the gate electrode within the remainder of the trench between the spacer structures, according to some embodiments. The gate dielectric may include any number of dielectric layers deposited using a CVD process, such as ALD. The gate electrode can include any number of conductive material layers, such as any metals, metal alloys, or polysilicon. The gate electrode may be deposited using electroplating, electroless plating, CVD, ALD, PECVD, or PVD, to name a few examples.

Method 1400 continues with operation 1410 where a liner structure is formed on at least the source or drain regions. According to some embodiments, a dielectric fill above the source or drain regions is recessed until a portion of the source or drain regions is exposed. The liner structure may be formed on any exposed portion of source or drain region and on any surface of the dielectric fill around the source or drain regions.

The liner structure may include any number of conductive layers that improve the performance of the device. For example, the liner structure may include a first conductive layer that includes a titanium-based material, such as such as titanium nitride, titanium silicide, or titanium germanosilicide, and a second conductive layer that includes a combination of tungsten, carbon, and nitrogen. The first layer may provide an enhanced ohmic contact between the source or drain region and any conductive contact formed on the liner structure, while the second layer may provide better adhesion for any conductive contact formed on the liner structure. Still other material layers may be used in the liner structure that include silicon and nitrogen in various concentrations. The liner structure may have a total thickness, for example, between about 2 nm and about 20 nm, such as between about 5 nm and about 15 nm or between about 7 nm and about 12 nm. In one such example, the liner structure includes a first conductive layer of titanium-based material (e.g., titanium nitride, titanium silicide, or titanium germano-silicide) and a second conductive layer that includes a combination of tungsten, carbon and nitrogen, and the overall thickness of the liner structure is between about 5 nm and about 15 nm or between about 7 nm and about 12 nm. The liner structure may be deposited, for example, using conformal deposition like CVD or ALD.

Method 1400 continues with operation 1412 where one or more conductive contacts are formed on the liner structure over the source or drain regions. The one or more conductive contacts may be any suitably conductive material such as tungsten (W). Other conductive materials may include copper (Cu), ruthenium (Ru), cobalt (Co), titanium (Ti), molybdenum (Mo), or any alloys thereof. Note that, in the absence of any gate cut structure interrupting the source/drain trench, the conductive contracts are able to form without hinderance. Had a gate cut structure been present adjacent to or cutting through the source or drain regions, the formation of the one or more conductive contacts would be interrupted by the gate cut structure and, as a result, could include voids or larger areas of incomplete fill. The conductive contacts may be deposited, for example, using deposition such as CVD or ALD.

Method 1400 continues with operation 1414 where a deep recess is formed through at least a full thickness of the gate structure. Due to the closeness of the devices, the deep recess may also cut through a portion of the one or more conductive contacts and/or expose a portion of the source or drain regions. The deep recess may be formed using a metal gate etch process that iteratively etches through portions of the gate electrode while simultaneously protecting the sidewalls of the recess from lateral etching to provide a high height-to-width aspect ratio final recess (e.g., aspect ratio of 5:1 or higher, 8:1 or higher, or 10:1 or higher).

Method 1400 continues with operation 1416 where the deep recess is filled with a dielectric material to complete the formation of a gate cut through the gate structure and into at least a portion of the one or more conductive contacts. The dielectric material may include one or more different dielectrics. For example, the dielectric material may include only silicon oxide or silicon nitride. In some examples, the dielectric material includes a first dielectric layer and a second dielectric layer on the first dielectric layer within a remaining volume of the deep recess. The first dielectric layer may include a high-k dielectric material (e.g., materials with a dielectric constant higher than that of silicon oxide or higher than 3.9) while the second dielectric layer may include a low-k dielectric material (e.g., materials with a dielectric constant equal to or lower than that of silicon oxide or equal to or lower than 3.9). Because the gate cut is formed after the formation of the one or more conductive contacts, the liner structure between the one or more conductive contacts and the source or drain regions may abut a sidewall of the gate cut, but does not extend any further up or down the sidewall of the gate cut. The dielectric material may be deposited, for example, using CVD or ALD.

Example System

Figure 15:
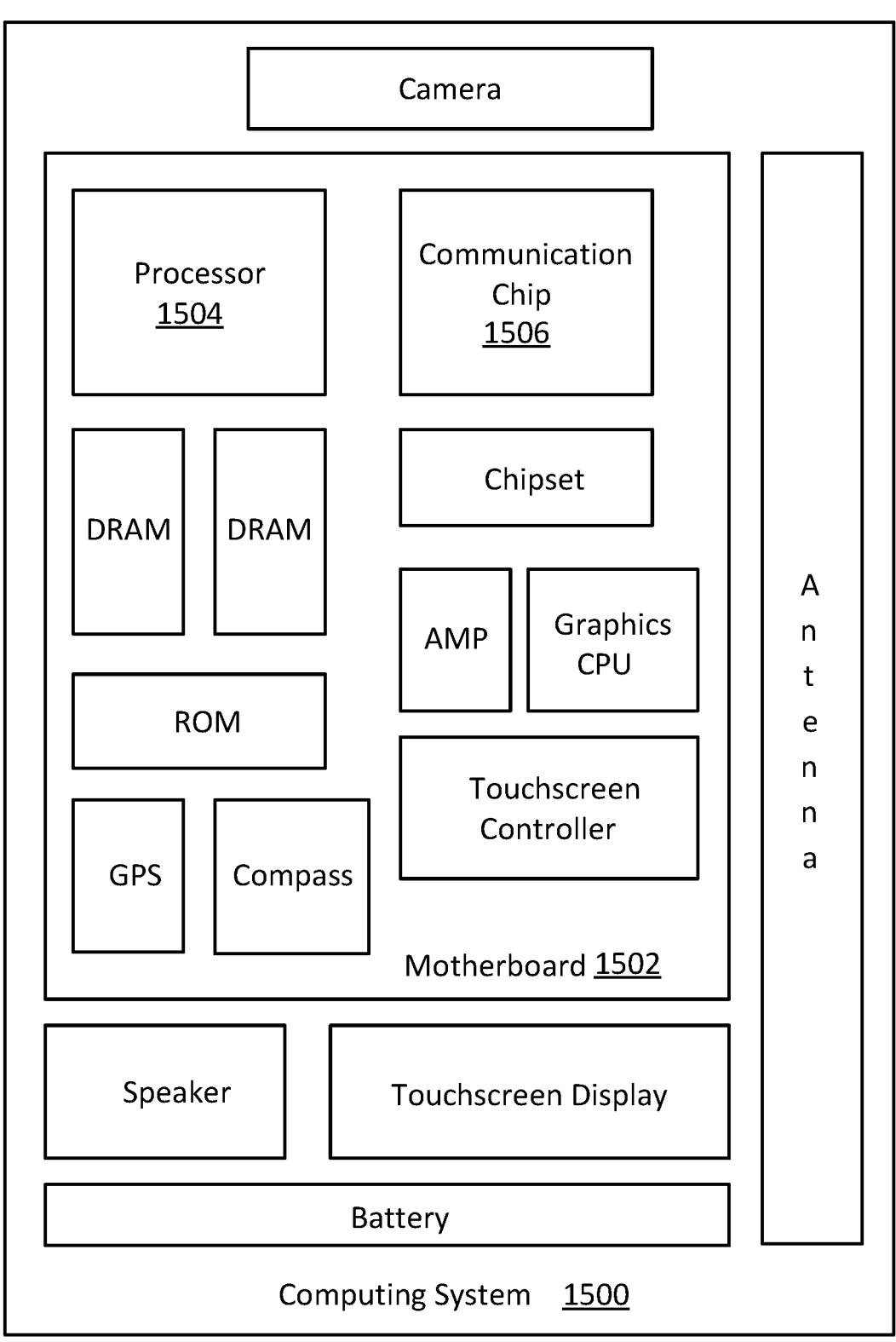
FIG. 15 illustrates a computing system including one or more integrated circuits, as variously described herein, in accordance with an embodiment of the present disclosure.

FIG. 15 is an example computing system implemented with one or more of the integrated circuit structures as disclosed herein, in accordance with some embodiments of the present disclosure. As can be seen, the computing system 1500 houses a motherboard 1502. The motherboard 1502 may include a number of components, including, but not limited to, a processor 1504 and at least one communication chip 1506, each of which can be physically and electrically coupled to the motherboard 1502, or otherwise integrated therein. As will be appreciated, the motherboard 1502 may be, for example, any printed circuit board (PCB), whether a main board, a daughterboard mounted on a main board, or the only board of system 1500, etc.

Depending on its applications, computing system 1500 may include one or more other components that may or may not be physically and electrically coupled to the motherboard 1502. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1500 may include one or more integrated circuit structures or devices configured in accordance with an example embodiment (e.g., a module including an integrated circuit on a substrate, the substrate having semiconductor devices and at least one gate cut formed after the conductive source/drain contacts). In some embodiments, multiple functions can be integrated into one or more chips (e.g., for instance, note that the communication chip 1506 can be part of or otherwise integrated into the processor 1504).

The communication chip 1506 enables wireless communications for the transfer of data to and from the computing system 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1506 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1500 may include a plurality of communication chips 1506. For instance, a first communication chip 1506 may be dedicated to shorter range wireless communications such as Wi-Fi and Bluetooth and a second communication chip 1506 may be dedicated to longer range wireless communications such as GPS, EDGE, GPRS, CDMA, WiMAX, LTE, Ev-DO, and others.

The processor 1504 of the computing system 1500 includes an integrated circuit die packaged within the processor 1504. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 1506 also may include an integrated circuit die packaged within the communication chip 1506. In accordance with some such example embodiments, the integrated circuit die of the communication chip includes one or more semiconductor devices as variously described herein. As will be appreciated in light of this disclosure, note that multi-standard wireless capability may be integrated directly into the processor 1504 (e.g., where functionality of any chips 1506 is integrated into processor 1504, rather than having separate communication chips). Further note that processor 1504 may be a chip set having such wireless capability. In short, any number of processor 1504 and/or communication chips 1506 can be used. Likewise, any one chip or chip set can have multiple functions integrated therein.

In various implementations, the computing system 1500 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 1500 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes a semiconductor region extending in a first direction from a first source or drain region to a second source or drain region, a gate structure extending in a second direction over the semiconductor region, a liner structure having one or more layers of conductive material on the first source or drain region, a conductive contact on the liner structure, and a gate cut adjacent to the semiconductor region and extending in the first direction through the gate structure and interrupting at least a portion of the conductive contact. The gate cut includes a dielectric material. An end of the liner structure abuts a sidewall of the gate cut. In some such cases, although the liner structure end abuts the gate cut, the liner structure does not extend any further up or down the sidewall of the gate cut. In some such examples, the liner structure includes one or more conformal layers and has an overall thickness in the range of about 5 nm to 15 nm. In some such cases, the thickness at the end of the liner structure that abuts the gate cut is 5 nm to 15 nm.

Example 2 includes the integrated circuit of Example 1, wherein the one or more layers of conductive material directly contact the conductive contact.

Example 3 includes the integrated circuit of Example 1 or 2, wherein the one or more layers of conductive material include a layer that has titanium.

Example 4 includes the integrated circuit of Example 3, wherein the layer that has titanium further includes nitrogen.

Example 5 includes the integrated circuit of any one of Examples 1-4, wherein the one or more layers of conductive material include a layer that has tungsten, carbon, and nitrogen.

Example 6 includes the integrated circuit of any one of Examples 1-5, wherein the semiconductor region comprises a plurality of semiconductor nanoribbons.

Example 7 includes the integrated circuit of Example 6, wherein the plurality of semiconductor nanoribbons comprise germanium, silicon, or a combination thereof.

Example 8 includes the integrated circuit of any one of Examples 1-7, wherein the gate structure includes a gate dielectric around the semiconductor region, and the gate dielectric is not present on any sidewall of the gate cut.

Example 9 includes the integrated circuit of any one of Examples 1-8, wherein the dielectric material comprises silicon and nitrogen.

Example 10 is a printed circuit board comprising the integrated circuit of any one of Examples 1-9.

Example 11 is an electronic device that includes a chip package comprising one or more dies. At least one of the one or more dies includes a semiconductor device having a semiconductor region extending in a first direction from a first source or drain region to a second source or drain region. The semiconductor device also includes a gate structure extending in a second direction over the semiconductor region, a liner structure having one or more layers of conductive material on the first source or drain region, and a conductive contact over the first source or drain region. The liner structure is between the first source or drain region and the conductive contact. The at least one of the one or more dies also includes a gate cut adjacent to the semiconductor region and extending in the first direction through the gate structure and interrupting at least a portion of the conductive contact. The gate cut includes a dielectric material. An end of the liner structure abuts a sidewall of the gate cut. In some such cases, although the liner structure end abuts the gate cut, the liner structure does not extend any further up or down the sidewall of the gate cut. In some such examples, the liner structure includes one or more conformal layers and has an overall thickness in the range of about 5 nm to 15 nm (e.g., about 7 nm to 12 nm). In some such cases, the liner structure end that abuts the gate cut has a thickness in the range of 5 nm to 15 nm (e.g., about 7 nm to 12 nm).

Example 12 includes the electronic device of Example 11, wherein the one or more layers of conductive material directly contact the conductive contact.

Example 13 includes the electronic device of Example 11 or 12, wherein the one or more layers of conductive material include a layer that has titanium.

Example 14 includes the electronic device of Example 13, wherein the layer that has titanium includes titanium and nitrogen.

Example 15 includes the electronic device of any one of Examples 11-14, wherein the one or more layers of conductive material include a layer that has tungsten, carbon, and nitrogen.

Example 16 includes the electronic device of any one of Examples 11-15, wherein the semiconductor region comprises a plurality of semiconductor nanoribbons.

Example 17 includes the electronic device of Example 16, wherein the plurality of semiconductor nanoribbons comprise germanium, silicon, or a combination thereof.

Example 18 includes the electronic device of any one of Examples 11-17, wherein the gate structure includes a gate dielectric around the semiconductor region, and the gate dielectric is not present on any sidewall of the gate cut.

Example 19 includes the electronic device of any one of Examples 11-18, wherein the dielectric material comprises silicon and nitrogen.

Example 20 includes the electronic device of any one of Examples 11-19, further comprising a printed circuit board, wherein the chip package is coupled to the printed circuit board.

Example 21 is a method of forming an integrated circuit. The method includes forming a fin comprising a semiconductor material, the fin extending above a substrate and extending in a first direction; forming a source or drain region at an end of the semiconductor material; forming a gate structure extending over the semiconductor material in a second direction different from the first direction; forming one or more layers of conductive material on the source or drain region; forming a conductive contact on the one or more layers of conductive material; forming a recess through the gate structure adjacent to the fin and through at least a portion of the conductive contact; and forming a dielectric material within the recess.

Example 22 includes the method of Example 21, wherein forming the source or drain region includes forming a sacrificial gate extending over the semiconductor material in the second direction; forming spacer structures on sidewalls of the sacrificial gate; removing portions of the fin not protected by the sacrificial gate and spacer structures; and forming the source or drain region at an exposed end of the semiconductor material from the fin beneath the sacrificial gate and spacer structures.

Example 23 includes the method of Example 21 or 22, wherein forming the one or more layers of conductive material comprises forming a layer that includes titanium.

Example 24 includes the method of any one of Examples 21-23, wherein forming the one or more layers of conductive material comprises forming a layer that includes tungsten, carbon, and nitrogen.

Example 25 includes the method of any one of Examples 21-24, wherein forming the dielectric material comprises forming a dielectric material that includes silicon and oxygen within the recess.

Example 26 is an integrated circuit that includes a semiconductor region extending in a first direction from a first source or drain region to a second source or drain region, a gate structure extending in a second direction over the semiconductor region, a first liner structure having one or more first layers of conductive material on the first source or drain region, a second liner structure having one or more second layers of conductive material on the second source or drain region, a first conductive contact on the first liner structure, a second conductive contact on the second liner structure, and a gate cut adjacent to the semiconductor region and extending in the first direction through the gate structure and interrupting at least a portion of the first conductive contact and at least a portion of the second conductive contact. The gate cut includes a dielectric material. An end of the first liner structure abuts a sidewall of the gate cut, and the first liner structure does not extend any further up or down the sidewall of the gate cut. Likewise, an end of the second liner structure abuts the sidewall of the gate cut, and the second liner structure does not extend any further up or down the sidewall of the gate cut. In some such examples, each of the first and second liner structures may include one or more conformal layers and have an overall thickness in the range of about 5 nm to 15 nm (e.g., about 7 nm to 12 nm). In some such examples, the first liner structure end that abuts the gate cut has a thickness in the range of 5 nm to 15 nm (e.g., about 7 nm to 12 nm); similarly, the second liner structure end that abuts the gate cut may has a thickness in the range of 5 nm to 15 nm (e.g., about 7 nm to 12 nm).

Example 27 includes the integrated circuit of Example 26, wherein the first liner structure directly contacts the first conductive contact, and the second liner structure directly contacts the second conductive contact.

Example 28 includes the integrated circuit of Example 26 or 27, wherein the one or more first layers of conductive material include a first layer that has titanium and the one or more second layers of conductive material include a second layer that has titanium.

Example 29 includes the integrated circuit of Example 28, wherein the first layer that has titanium and the second layer that has titanium each includes titanium and nitrogen.

Example 30 includes the integrated circuit of any one of Examples 26-29, wherein the one or more first layers of conductive material include a layer that has tungsten, carbon, and nitrogen, and the one or more second layers of conductive material include a layer that has tungsten, carbon, and nitrogen.

Example 31 includes the integrated circuit of any one of Examples 26-30, wherein the semiconductor region comprises a plurality of semiconductor nanoribbons.

Example 32 includes the integrated circuit of Example 31, wherein the plurality of semiconductor nanoribbons comprise germanium, silicon, or a combination thereof.

Example 33 includes the integrated circuit of any one of Examples 26-32, wherein the gate structure includes a gate dielectric around the semiconductor region, and the gate dielectric is not present on any sidewall of the gate cut.

Example 34 includes the integrated circuit of any one of Examples 26-33, wherein the dielectric material comprises silicon and nitrogen.

Example 35 is a printed circuit board comprising the integrated circuit of any one of Examples 26-34.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:
a semiconductor region extending in a first direction from a first source or drain region to a second source or drain region;
a gate structure extending in a second direction over the semiconductor region;
a liner structure comprising one or more layers of conductive material on the first source or drain region;
a conductive contact on the liner structure; and
a gate cut adjacent to the semiconductor region and extending in the first direction through the gate structure and interrupting at least a portion of the conductive contact, the gate cut comprising a dielectric material and extending along an entire height of the first source or drain region;
wherein an end of the liner structure abuts a sidewall of the gate cut and the liner structure does not extend any further up or down the sidewall of the gate cut.

2. The integrated circuit of claim 1, wherein the one or more layers of conductive material include a layer that has titanium.

3. The integrated circuit of claim 2, wherein the layer that has titanium further includes nitrogen.

4. The integrated circuit of claim 1, wherein the one or more layers of conductive material include a layer that has tungsten, carbon, and nitrogen.

5. The integrated circuit of claim 1, wherein the gate structure includes a gate dielectric around the semiconductor region, and the gate dielectric is not present on any sidewall of the gate cut.

6. The integrated circuit of claim 1, wherein the dielectric material comprises silicon and nitrogen.

7. A printed circuit board comprising the integrated circuit of claim 1.

8. An electronic device, comprising:
a chip package comprising one or more dies, at least one of the one or more dies comprising:
a first semiconductor device having a first semiconductor region extending in a first direction from a first source or drain region, a first gate structure extending in a second direction over the first semiconductor region, a first liner structure having one or more first layers of conductive material on the first source or drain region, and a first conductive contact over the first source or drain region, such that the first liner structure is between the first source or drain region and the first conductive contact;
a second semiconductor device having a second semiconductor region extending in the first direction from a second source or drain region, a second gate structure extending in the second direction over the second semiconductor region, a second liner structure having one or more second layers of conductive material on the second source or drain region, and a second conductive contact over the second source or drain region, such that the second liner structure is between the second source or drain region and the second conductive contact; and
a gate cut between the first semiconductor region and the second semiconductor region and extending in the first direction between the first conductive contact and the second conductive contact, the gate cut comprising a dielectric material;
wherein an end of the first liner structure abuts a first sidewall of the gate cut, and an end of the second liner structure abuts a second sidewall of the gate cut opposite from the first sidewall.

9. The electronic device of claim 8, wherein the one or more first layers of conductive material include a layer that has titanium.

10. The electronic device of claim 9, wherein the layer that has titanium includes titanium and nitrogen.

11. The electronic device of claim 8, wherein the one or more first layers of conductive material include a layer that has tungsten, carbon, and nitrogen.

12. The electronic device of claim 8, wherein the gate structure includes a gate dielectric around the semiconductor region, and the gate dielectric is not present on any sidewall of the gate cut.

13. The electronic device of claim 8, wherein the dielectric material comprises silicon and nitrogen.

14. The electronic device of claim 8, further comprising a printed circuit board, wherein the chip package is coupled to the printed circuit board.

15. An integrated circuit comprising:

a semiconductor region extending in a first direction from a first source or drain region to a second source or drain region;

a gate structure extending in a second direction over the semiconductor region;

a first liner structure having one or more first layers of conductive material on the first source or drain region;

a second liner structure having one or more second layers of conductive material on the second source or drain region;

a first conductive contact on the first liner structure;

a second conductive contact on the second liner structure; and a gate cut adjacent to the semiconductor region and extending in the first direction through the gate structure and interrupting at least a portion of the first conductive contact and at least a portion of the second conductive contact, the gate cut comprising a dielectric material and extending along an entire height of the first source or drain region and the second source or drain region;

wherein an end of the first liner structure abuts a sidewall of the gate cut, and an end of the second liner structure abuts the sidewall of the gate cut.

16. The integrated circuit of claim 15, wherein the one or more first layers of conductive material include a first layer that has titanium and the one or more second layers of conductive material include a second layer that has titanium.

17. The integrated circuit of claim 15, wherein the one or more first layers of conductive material include a layer that has tungsten, carbon, and nitrogen, and the one or more second layers of conductive material include a layer that has tungsten, carbon, and nitrogen.

18. The integrated circuit of claim 15, wherein the gate structure includes a gate dielectric around the semiconductor region, and the gate dielectric is not present on any sidewall of the gate cut.

19. The integrated circuit of claim 15, wherein the dielectric material comprises silicon and nitrogen.

20. A printed circuit board comprising the integrated circuit of claim 15.

* * * * *